(12) United States Patent
Lee et al.

(10) Patent No.: US 11,733,814 B2
(45) Date of Patent: Aug. 22, 2023

(54) TOUCH SENSING DEVICE AND ELECTRONIC APPARATUS HAVING IMPROVED TOUCH SENSING IDENTIFICATION

(71) Applicant: Samsung Electro-Mechanics Co., Ltd, Suwon-si (KR)

(72) Inventors: Joo Hyoung Lee, Suwon-si (KR); Joo Yul Ko, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 174 days.

(21) Appl. No.: 17/110,700

(22) Filed: Dec. 3, 2020

(65) Prior Publication Data

US 2021/0382579 A1 Dec. 9, 2021

(30) Foreign Application Priority Data

Jun. 3, 2020 (KR) .......................... 10-2020-0066813
Aug. 31, 2020 (KR) .......................... 10-2020-0110345
Sep. 10, 2020 (KR) .......................... 10-2020-0116281

(51) Int. Cl.
*G06F 3/044* (2006.01)
*H03K 17/96* (2006.01)

(52) U.S. Cl.
CPC .......... *G06F 3/0445* (2019.05); *H03K 17/962* (2013.01); *G06F 2203/04105* (2013.01); *H03K 2217/960735* (2013.01)

(58) Field of Classification Search
CPC ........ G06F 3/0445; G06F 2203/04105; H03K 17/962; H03K 2217/960735
See application file for complete search history.

(56) References Cited

U.S. PATENT DOCUMENTS

| 11,025,761 B1* | 6/2021 | Shim ................... H04M 1/0202 |
| 2002/0036622 A1* | 3/2002 | Jaeger .................. G06F 3/0433 |
| | | 345/173 |
| 2010/0045360 A1* | 2/2010 | Howard ................ G01D 5/202 |
| | | 327/365 |

FOREIGN PATENT DOCUMENTS

| CN | 104808404 A | * | 7/2015 | ......... G02F 1/13338 |
| JP | 2012-168747 A | | 9/2012 | |
| KR | 10-1175073 B1 | | 8/2012 | |

* cited by examiner

*Primary Examiner* — Benjamin C Lee
*Assistant Examiner* — Nathan P Brittingham
(74) *Attorney, Agent, or Firm* — NSIP Law

(57) ABSTRACT

A touch sensing device includes: a first touch sensing unit including a first sensing electrode and a first sensing inductor electrically connected to each other, wherein capacitance of the first touch sensing unit varies depending on parasitic capacitance formed between the first sensing electrode and a human body according to a contact of the human body; a first force sensing unit including a first sensing coil spaced apart from an internal side surface of a frame, wherein inductance of the first force sensing unit varies depending on a change in distance between the first sensing coil and the frame according to a pressing touch; and a circuit unit configured to detect whether a touch of the human body is input, based on variations in the capacitance of the first touch sensing unit and variations in the inductance with the force sensing unit.

42 Claims, 17 Drawing Sheets

TOUCH SENSING DEVICE AND ELECTRONIC APPARATUS HAVING IMPROVED TOUCH SENSING IDENTIFICATION

CROSS-REFERENCE TO RELATED APPLICATIONS

This application claims the benefit under 35 USC § 119(a) of Korean Patent Application Nos. 10-2020-0066813, 10-2020-0110345, and 10-2020-0116281 filed on Jun. 3, 2020, Aug. 31, 2020, and Sep. 10, 2020, respectively, in the Korean Intellectual Property Office, the entire disclosures of which are incorporated herein by reference for all purposes.

BACKGROUND

1. Field

This disclosure relates to a touch sensing device and an electronic apparatus having improved touch sensing identification.

2. Description of Related Art

In general, it is desirable that a wearable device be thin and have a simple, clean design. To achieve these attributes, existing mechanical switches in wearable devices may be replaced with non-mechanical switches implemented using dustproofing and waterproofing technologies, enabling the production of wearable devices having seamless housings.

For the purpose of implementing and developing non-mechanical switches, current technologies such as touch-on-metal (ToM) technology implementing touches on a metal surface, a capacitance sensing method using a touch panel, a microelectromechanical system (MEMS), a micro strain gauge, and other technologies have been developed. In addition, a force touch function that can determine how forcefully a button has been pushed is under development.

In the case of an existing mechanical switch, in addition to other problems, a large size and a large amount of internal space may be required to implement a switching function, and a design may be somewhat untidy and a large amount of space may be required due to an outwardly protruding shape of the switch, which has a structure that is not integrated with an external case.

In addition, there may be a risk of an electric shock due to direct contact with an electrically connected mechanical switch. Moreover, a structure of the mechanical switch may make it difficult to implement dustproofing and waterproofing.

Even in an existing switching device having a touch switching unit replacing mechanical switches, multi-touch locations need to be distinguished. When a plurality of touch switches of an existing switching device, replacing mechanical switches, are disposed on a metal case, it may be difficult to distinguish and recognize locations of the plurality of touch switches.

The above information is presented as background information only to assist with an understanding of the present disclosure. No determination has been made, and no assertion is made, as to whether any of the above might be applicable as prior art with regard to the disclosure.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a touch sensing device is applied to an electronic apparatus including a side portion having a cover and a frame, and a touch switch unit including a first touch member and a first force member. The touch sensing device includes: a first touch sensing unit disposed inside the cover and including a first sensing electrode and a first sensing inductor electrically connected to each other, wherein capacitance of the first touch sensing unit varies depending on parasitic capacitance formed between the first sensing electrode and a human body according to a contact of the human body applied through the first touch member; a first force sensing unit including a first sensing coil disposed to be spaced apart from an internal side surface of the frame, wherein inductance of the first force sensing unit varies depending on a change in distance between the first sensing coil and the frame according to a pressing touch applied through the first force member; and a circuit unit configured to detect whether a touch of the human body is input, based on variations in the capacitance of the first touch sensing unit and variations in the inductance of the first force sensing unit.

The first sensing electrode may be disposed inside the first touch member, wherein the first touch member is a portion of the cover. The first sensing inductor may be mounted on a substrate. The first touch sensing unit may further include a first connection wire electrically connecting the first sensing electrode and one end of the first sensing inductor to each other.

The first sensing electrode may include two first sensing electrodes disposed in different locations of an internal side of a first touch member that is a portion of a cover, and connected to the one end and another end of the first sensing inductor. The first connection wire may include two first connection wires respectively electrically connecting the two first sensing electrodes to the one end and the other end of the first sensing inductor.

The first sensing coil may be disposed to be spaced apart from the first force member and may be mounted on a substrate to oppose an internal side surface of the first force member. The first force member may be a portion of the frame. The first force sensing unit may further include a first support member including a first body member supported by an internal structure of the frame and configured to support a portion of the substrate on which the first sensing coil is mounted, and first column members supported on the first body member and attached to ends of the first force member.

The touch sensing device may further include: a second touch sensing unit disposed inside the cover and including a second sensing electrode and a second sensing inductor electrically connected to each other, wherein capacitance of the second touch sensing unit varies depending on parasitic capacitance formed between the second sensing electrode and the human body according to a contact of the human body applied through a second touch member of the cover.

The second sensing electrode may be disposed inside a second touch member that is a portion of the cover, wherein the second sensing inductor is mounted on a substrate, and wherein the second touch sensing unit further includes a second connection wire electrically connecting the second sensing electrode and one end of the second sensing inductor to each other.

The second sensing electrode may include two second sensing electrodes disposed in different locations of an internal side of a second touch member that is a portion of the cover, and connected to one end and another end of the second sensing inductor. The second connection wire may include two second connection wires respectively electrically connecting the two second sensing electrodes to the one end and the other end of the second sensing inductor.

The circuit unit may include: a first touch detection circuit configured to output, in response to the contact of the human body applied through the first touch member occurring, a first touch detection signal for the first touch member based on capacitance variation depending on the parasitic capacitance formed between the first sensing electrode and the human body; a first force detection circuit configured to output, in response to the pressing touch applied through the first force member occurring, a first force detection signal for the first force member based on inductance variation occurring as the first force member is inwardly deflected; a second touch detection circuit configured to output, in response to the contact of the human body applied through the second touch member occurring, a second touch detection signal for the second touch member based on capacitance variation depending on the parasitic capacitance formed between the second sensing electrode and the human body; and a touch identification circuit configured to identify a touch switch based on the first touch detection signal, the first force detection signal, and the second touch detection signal.

The first touch member, the first force member, and the second touch member may be disposed in a zigzag form.

A boundary of the frame and the cover may have a zigzag form. The first touch member, the first force member, and the second touch member may be disposed on a straight line.

The touch sensing device may further include: a second force sensing unit including a second sensing coil disposed to be spaced apart from the internal side surface of the frame, wherein inductance of the second force sensing unit varies depending on a change in distance between the second sensing coil and the frame according to a pressing touch applied through a second force member that is a portion of the frame.

The second sensing coil may be disposed to be spaced apart from an internal side surface of the second force member. The second force sensing unit may further include a second support member including: a second body member supported by an internal structure of the frame, and configured to support a portion of the substrate on which the second sensing coil is mounted; and second column members supported on the second body member and attached to ends of the second force member.

The first sensing electrode may be disposed on an entire internal side of the cover opposing the first and second sensing coils and the first sensing inductor.

The circuit unit may include: a first force detection circuit configured to output, in response to the pressing touch applied through the first force member occurring, a first force detection signal for the first force member based on inductance variation occurring as the first force member is inwardly deflected; a first touch detection circuit configured to output, in response to the contact of the human body applied through the first touch member occurring, a first touch detection signal for the first touch member based on capacitance variation depending on the parasitic capacitance formed between the first sensing electrode and the human body; a second force detection circuit configured to output, in response to the pressing touch applied through the second force member occurring, a second force detection signal for the second force member based on inductance variation occurring as the second force member is inwardly deflected; and a touch identification circuit configured to identify a location of the touch of the human body based on the first force detection signal, the first touch detection signal, and the second force detection signal.

In another general aspect, a touch sensing device is applied to an electronic apparatus including a side portion having a cover and a frame, a first touch member and a second touch member that are each a portion of the cover, and a first force member and a second force member that are each a portion of the frame. The touch sensing device includes: a first hybrid sensing unit disposed inside the cover and including a first sensing electrode and a first sensing inductor electrically connected to each other, and a first sensing coil disposed to be spaced apart from an internal side surface of the frame, wherein capacitance of the first hybrid sensing unit varies depending on parasitic capacitance formed between the first sensing electrode and a human body according to a touch of the human body applied through the first touch member and the first force member, and inductance of the first hybrid sensing unit varies depending on a change in distance between the first sensing coil and the frame according to the touch of the human body applied through the first touch member and the first force member; a second hybrid sensing unit disposed inside the cover and including a second sensing electrode and a second sensing inductor electrically connected to each other, and a second sensing coil disposed to be spaced apart from the internal side surface of the frame, wherein capacitance of the second hybrid sensing unit varies depending on parasitic capacitance formed between the second sensing electrode and the human body according to a touch of the human body applied through the second touch member and the second force member, and inductance of the second hybrid sensing unit varies depending on a change in distance between the second sensing coil and the frame according to the touch of the human body applied through the second touch member and the second force member; and a circuit unit configured to detect whether each of the touch of the human body applied through the first touch member and the first force member and the touch of the human body applied through the second touch member and the second force member is input, based on a variation in the capacitance of the first hybrid sending unit, a variation in the capacitance of the second hybrid sensing unit, a variation in the inductance of the first hybrid sensing unit, and a variation in the inductance of the second hybrid sensing unit.

The first sensing electrode may be disposed inside the first touch member. The first sensing inductor may be mounted on a substrate. The first sensing coil may be disposed to be spaced apart from an internal side surface of the first force member and may be mounted on the substrate to oppose the internal side surface of the first force member. The first hybrid sensing unit may further include: a first connection wire electrically connecting the first sensing electrode and one end of the first sensing inductor to each other; and a first support member including a first body member supported by an internal structure of the frame and configured to support a portion of the substrate on which the first sensing coil is mounted, and first column members supported on the first body member and attached to ends of the first force member.

The second sensing electrode may be disposed inside the second touch member. The second sensing inductor may be mounted on a substrate. The second sensing coil may be disposed to be spaced apart from an internal side surface of the second force member and may be mounted on the substrate to oppose the internal side surface of the second force member. The second hybrid sensing unit may further include: a second connection wire electrically connecting the second sensing electrode and one end of the second sensing inductor to each other; and a second support member including a second body member supported by an internal structure of the frame and configured to support a portion of the substrate on which the second sensing coil is mounted, and second column members supported on the second body member and attached to ends of the second force member.

The touch sensing device may further include a shielding member formed of an insulating material disposed to surround at least a portion of the first connection wire.

The circuit unit may include: a first touch detection circuit configured to output, in response to the touch applied through the first touch member and the first force member occurring, a first touch detection signal for the first touch member based on capacitance variation depending on the parasitic capacitance formed between the first sensing electrode and the human body; a first force detection circuit configured to output, in response to the touch applied through the first touch member and the first force member occurring, a first force detection signal for the first force member based on inductance variation occurring as the first force member is inwardly deflected; a second touch detection circuit configured to output, in response to the touch applied through the second touch member and the second force member occurring, a second touch detection signal for the second touch member based on capacitance variation depending on the parasitic capacitance formed between the second sensing electrode and the human body; a second force detection circuit configured to output, in response to the touch applied through the second touch member and the second force member occurring, a second force detection signal for the second force member based on inductance variation occurring as the second force member is inwardly deflected; and a touch identification circuit configured to identify a touch switch based on the first touch detection signal, the first force detection signal, the second touch detection signal, and the second force detection signal.

In another general aspect, an electronic apparatus includes: a side portion including a cover and a frame coupled to the cover; a touch switch unit including a first touch member that is a portion of the cover, and a force member that is a portion of the frame; a first touch sensing unit disposed inside the cover and including a first sensing electrode and a first sensing inductor electrically connected to each other, wherein capacitance of the first touch sensing unit varies depending on parasitic capacitance formed between the first sensing electrode and a human body according to a contact of the human body applied through the first touch member; a first force sensing unit including a first sensing coil disposed to be spaced apart from an internal side surface of the frame, wherein inductance of the first force sensing unit varies depending on a change in distance between the first sensing coil and the frame according to a pressing touch applied through the first force member; and a circuit unit configured to detect whether a touch of the human body is input, based on variations in the capacitance of the first touch sensing unit and variations in the inductance of the force sensing unit.

The first sensing electrode may be disposed inside the first touch member. The first sensing inductor may be mounted on a substrate. The first touch sensing unit may further include a first connection wire electrically connecting the sensing electrode and one end of the first sensing inductor to each other.

The first sensing electrode may include two first sensing electrodes disposed in different locations of an internal side of the first touch member, and connected to the one end and another end of the first sensing inductor. The first connection wire may include two first connection wires respectively electrically connecting the two first sensing electrodes to the one end and the other end of the first sensing inductor.

The first sensing coil may be disposed to be spaced apart from the first force member and may be mounted on a substrate to oppose an internal side surface of the first force member. The first force sensing unit may further include a first support member including a first body member supported by an internal structure of the frame and configured to support a portion of the substrate on which the first sensing coil is mounted, and first column members supported on the first body member and attached to ends of the first force member.

The electronic apparatus may further include: a second touch sensing unit disposed inside the cover and including a second sensing electrode and a second sensing inductor electrically connected to each other, wherein capacitance of the second touch sensing unit varies depending on parasitic capacitance formed between the second sensing electrode and the human body according to a contact of the human body applied through a second touch member of the cover.

The second sensing electrode may be disposed inside a second touch member. The second sensing inductor may be mounted on a substrate. The second touch sensing unit may further include a second connection wire electrically connecting the second sensing electrode and one end of the second sensing inductor to each other.

The second sensing electrode may include two second sensing electrodes disposed in different locations of an internal side of the second touch member, and connected to the one end and another end of the second sensing inductor. The second connection wire may include two second connection wires respectively electrically connecting the two second sensing electrodes to the one end and the other end of the second sensing inductor.

The circuit unit may include: a first touch detection circuit configured to output, in response to the contact of the human body applied through the first touch member occurring, a first touch detection signal for the first touch member based on capacitance variation depending on the parasitic capacitance formed between the first sensing electrode and the human body; a first force detection circuit configured to output, in response to the pressing touch applied through the first force member occurring, a first force detection signal for the first force member based on inductance variation occurring as the first force member is inwardly deflected; a second touch detection circuit configured to output, in response to the contact of the human body applied through the second touch member occurring, a second touch detection signal for the second touch member based on capacitance variation depending on the parasitic capacitance formed between the second sensing electrode and the human body; and a touch identification circuit configured to identify a touch switch based on the first touch detection signal, the first force detection signal, and the second touch detection signal.

The first touch member, the first force member, and the second touch member may be disposed in a zigzag form.

A boundary of the frame and the cover may have a zigzag form. The first touch member, the first force member, and the second touch member may be disposed on a straight line.

The electronic apparatus may further include: a second force sensing unit including a second sensing coil disposed to be spaced apart from an internal side surface of the frame, wherein inductance of the second force sensing unit varies depending on a change in distance between the second sensing coil and the frame according to a pressing touch applied through a second force member that is a portion of the frame.

The second sensing coil may be disposed to be spaced apart from an internal side surface of the second force member. The second force sensing unit may further include a second support member including: a second body member supported by an internal structure of the frame and configured to support a substrate on which the second sensing coil is mounted; and second column members supported on the second body member and attached to ends of the second force member.

The first sensing electrode may be disposed on an entire internal side of the cover opposing the first and second sensing coils and the first sensing inductor.

The circuit unit may include: a first force detection circuit configured to output, in response to the pressing touch applied through the first force member occurring, a first force detection signal for the first force member based on inductance variation occurring as the first force member is inwardly deflected; a first touch detection circuit configured to output, in response to the contact of the human body applied through the first touch member occurring, a first touch detection signal for the first touch member based on capacitance variation depending on the parasitic capacitance formed between the first sensing electrode and the human body; a second force detection circuit configured to output, in response to the pressing touch applied through the second force member occurring, a second force detection signal for the second force member based on inductance variation occurring as the second force member is inwardly deflected; and a touch identification circuit configured to identify a location of the touch of the human body based on the first force detection signal, the first touch detection signal, and the second force detection signal.

In another general aspect, an electronic apparatus includes: a side portion including a cover and a frame coupled to the cover; a touch switch unit including a first touch member and a second touch member that are portions of the cover, and a first force member and a second force member that are portions of the frame; a first hybrid sensing unit disposed inside the cover and including a first sensing electrode and a first sensing inductor electrically connected to each other, and a first sensing coil disposed to be spaced apart from an internal side surface of the frame, wherein capacitance of the first hybrid sensing portion varies depending on parasitic capacitance formed between the first sensing electrode and a human body according to a touch of the human body applied through the first touch member and the first force member, and inductance of the first hybrid sensing unit varies depending on a change in distance between the first sensing coil and the frame according to the touch of the human body applied through the first touch member and the first force member; a second hybrid sensing unit disposed inside the cover and including a second sensing electrode and a second sensing inductor electrically connected to each other, and a second sensing coil disposed to be spaced apart from the internal side surface of the frame, wherein capacitance of the second hybrid sensing portion varies depending on parasitic capacitance formed between the second sensing electrode and the human body according to a touch of the human body applied through the second touch member and the second force member, and inductance of the second hybrid portion varies depending on a change in distance between the second sensing coil and the frame according to the touch of the human body applied through the second touch member and the second force member; and a circuit unit configured to detect whether each of touch of the human body applied through the first touch member and the first force member and the touch of the human body applied through the second touch member and the second force member is input, based on a variation in the capacitance of the first hybrid sending unit, a variation in the capacitance of the second hybrid sensing unit, a variation in the inductance of the first hybrid sensing unit and a variation in the inductance of the second hybrid sensing unit.

The first sensing electrode may be disposed inside the first touch member. The first sensing inductor may be mounted on a substrate. The first sensing coil may be disposed to be spaced apart from the first force member and may be mounted on the substrate to oppose an internal side surface of the first force member. The first hybrid sensing unit may further include: a first connection wire electrically connecting the first sensing electrode and one end of the first sensing inductor to each other; and a first support member including a first body member supported by an internal structure of the frame and configured to support a portion of the substrate on which the first sensing coil is mounted, and first column members supported on the first body member and attached to ends of the first force member.

The second sensing electrode may be disposed inside the second touch member. The second sensing inductor may be mounted on a substrate. The second sensing coil may be disposed to be spaced apart from the second force member and may be mounted on the substrate to oppose an internal side surface of the second force member. The second hybrid sensing unit may further include: a second connection wire electrically connecting the second sensing electrode and one end of the second sensing inductor to each other; and a second support member including a second body member supported by an internal structure of the frame and configured to support a portion of the substrate on which the second sensing coil is mounted, and second column members supported on the second body member and attached to ends of the second force member.

The electronic apparatus may further include: a shielding member formed of an insulating material disposed to surround at least a portion of the first connection wire.

The circuit unit may include: a first touch detection circuit configured to output, in response to the touch applied through the first touch member and the first force member occurring, a first touch detection signal for the first touch member based on capacitance variation depending on the parasitic capacitance formed between the first sensing electrode and the human body; a first force detection circuit configured to output, in response to the touch applied through the first touch member and the first force member occurring, a first force detection signal for the first force member based on inductance variation occurring as the first force member is inwardly deflected; a second touch detection circuit configured to output, in response to the touch applied through the second touch member and the second force member occurring, a second touch detection signal for the second touch member based on capacitance variation depending on the parasitic capacitance formed between the second sensing electrode and the human body; a second force detection circuit configured to output, in response to the touch applied through the second touch member and the second force member occurring, a second force detection signal for the second force member based on inductance variation occurring as the second force member is inwardly deflected; and a touch identification circuit configured to identify a touch switch based on the first touch detection signal, the first force detection signal, the second touch detection signal, and the second force detection signal.

In another general aspect, a touch sensing device is applied to an electronic apparatus in which a cover, formed of a first nonconductive material, and a frame, formed of second a conductive material the same as or different than the first nonconductive material, are coupled to each other. The touch sensing device includes: a touch sensing unit disposed inside the cover and configured to output a first sensing signal, depending on whether a contact is applied to the cover; a force sensing unit including a sensing coil disposed to be spaced apart from an internal side surface of the frame, the force sensing unit being configured to output a second sensing signal having a variable magnitude, depending on whether a pressing touch is applied through the frame; and a circuit unit configured to detect whether a touch is input by a human body, based on the first sensing signal and the second sensing signal.

The touch sensing unit may include a light source unit configured to generate and transmit an optical signal to an outside of the cover, and a reception unit configured to receive a reflected signal incident after the optical signal is reflected by an external object and then passes through the cover.

The touch sensing unit may include a reception unit configured to generate and transmit an ultrasonic signal to an outside of the cover, and a reception unit configured to receive a reflected signal incident after the ultrasonic signal is reflected by an external object and then passes through the cover.

The sensing coil may be spaced apart from a force member that is a portion of the frame and may be mounted on a substrate to oppose an internal side surface of the force member. The force sensing unit may further include a support member supported by an internal structure of the frame, the support member being configured to support the force member such that a predetermined distance from the force member to the sensing coil is maintained when the pressing touch is not applied through the force member, and to allow the force member to be inwardly deflected when the pressing touch is applied through the force member.

The circuit unit may include: a first detection unit configured to output a first detection signal in response to a magnitude of the first sensing signal being greater than or equal to a first threshold value; a second detection unit configured to output a second detection signal in response to a magnitude of the second sensing signal being greater than or equal to a second threshold value; and a touch detection circuit configured to determine whether the touch is input by the human body, based on the first detection signal and the second detection signal.

The touch sensing unit may include any one or any combination of any two or more of an optical sensor, an ultrasonic sensor, and a temperature sensor.

In another general aspect, an electronic apparatus includes: a side portion including a cover and a frame coupled to the cover; a touch switch unit including a touch member that is a portion of the cover, and a force member that is a portion of the frame; a touch sensing unit disposed inside the cover and configured to output a first sensing signal, depending on whether a contact is applied to the cover; and a force sensing unit including a sensing coil disposed to be spaced apart from an internal side surface of the frame, the force sensing unit being configured to output a second sensing signal having a variable magnitude, depending on whether a pressing touch is applied through the frame; and a circuit unit configured to detect whether a touch is input by the human body, based on the first sensing signal and the second sensing signal.

The touch sensing unit may include a light source unit configured to generate and transmit an optical signal to an outside of the cover, and a reception unit configured to receive a reflected signal incident after the optical signal is reflected by an external object and then passes through the cover.

The touch sensing unit may include a reception unit configured to generate and transmit an ultrasonic signal to an outside of the cover, and a reception unit configured to receive a reflected signal incident after the ultrasonic signal is reflected by an external object and then passes through the cover.

The sensing coil may be spaced apart from the force member and may be mounted on a substrate to oppose an internal side surface of the force member. The force sensing unit may further include a support member supported by an internal structure of the frame, the support member being configured to support the force member such that a predetermined distance from the force member to the sensing coil is maintained when the pressing touch is not applied through the force member, and to allow the force member to be inwardly deflected when the pressing touch is applied through the force member.

The circuit unit may include: a first detection unit configured to output a first detection signal in response to a magnitude of the first sensing signal being greater than or equal to a first threshold value; a second detection unit configured to output a second detection signal in response to a magnitude of the second sensing signal being greater than or equal to a second threshold value; and a touch detection circuit configured to determine whether the touch is input by the human body, based on the first detection signal and the second detection signal.

The touch sensing unit may include any one or any combination of any two or more of an optical sensor, an ultrasonic sensor, and a temperature sensor.

Other features and aspects will be apparent from the following detailed description, the drawings, and the claims.

BRIEF DESCRIPTION OF DRAWINGS

Throughout the drawings and the detailed description, the same reference numerals and characters refer to the same elements. The drawings may not be to scale, and the relative size, proportions, and depictions of elements in the drawings may be exaggerated for clarity, illustration, and convenience.

DETAILED DESCRIPTION

Figure 1:
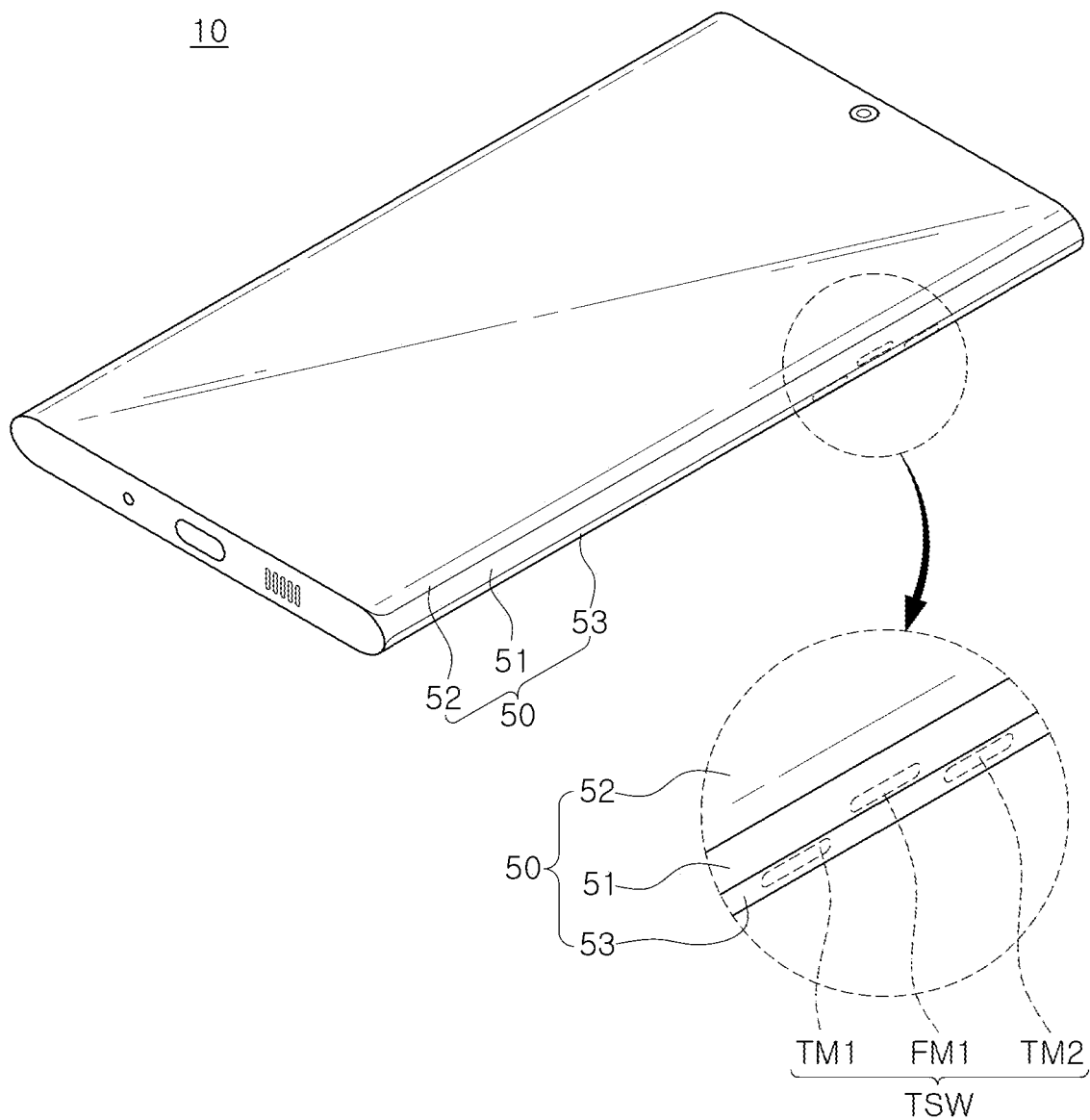
FIG. 1 is a perspective view illustrating an electronic apparatus, according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of this disclosure. For example, the sequences of operations described herein are merely examples, and are not limited to those set forth herein, but may be changed as will be apparent after an understanding of this disclosure, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of this disclosure. Hereinafter, while embodiments of the present disclosure will be described in detail with reference to the accompanying drawings, it is noted that examples are not limited to the same.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween. As used herein "portion" of an element may include the whole element or less than the whole element.

As used herein, the term "and/or" includes any one and any combination of any two or more of the associated listed items; likewise, "at least one of" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms, such as "above," "upper," "below," "lower," and the like, may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above," or "upper" relative to another element would then be "below," or "lower" relative to the other element. Thus, the term "above" encompasses both the above and below orientations depending on the spatial orientation of the device. The device may be also be oriented in other ways (rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of this disclosure. Further, although the examples described herein have a variety of configurations, other configurations are possible as will be apparent after an understanding of this disclosure.

Herein, it is noted that use of the term "may" with respect to an example, for example, as to what an example may include or implement, means that at least one example exists in which such a feature is included or implemented while all examples are not limited thereto.

Figure 2:
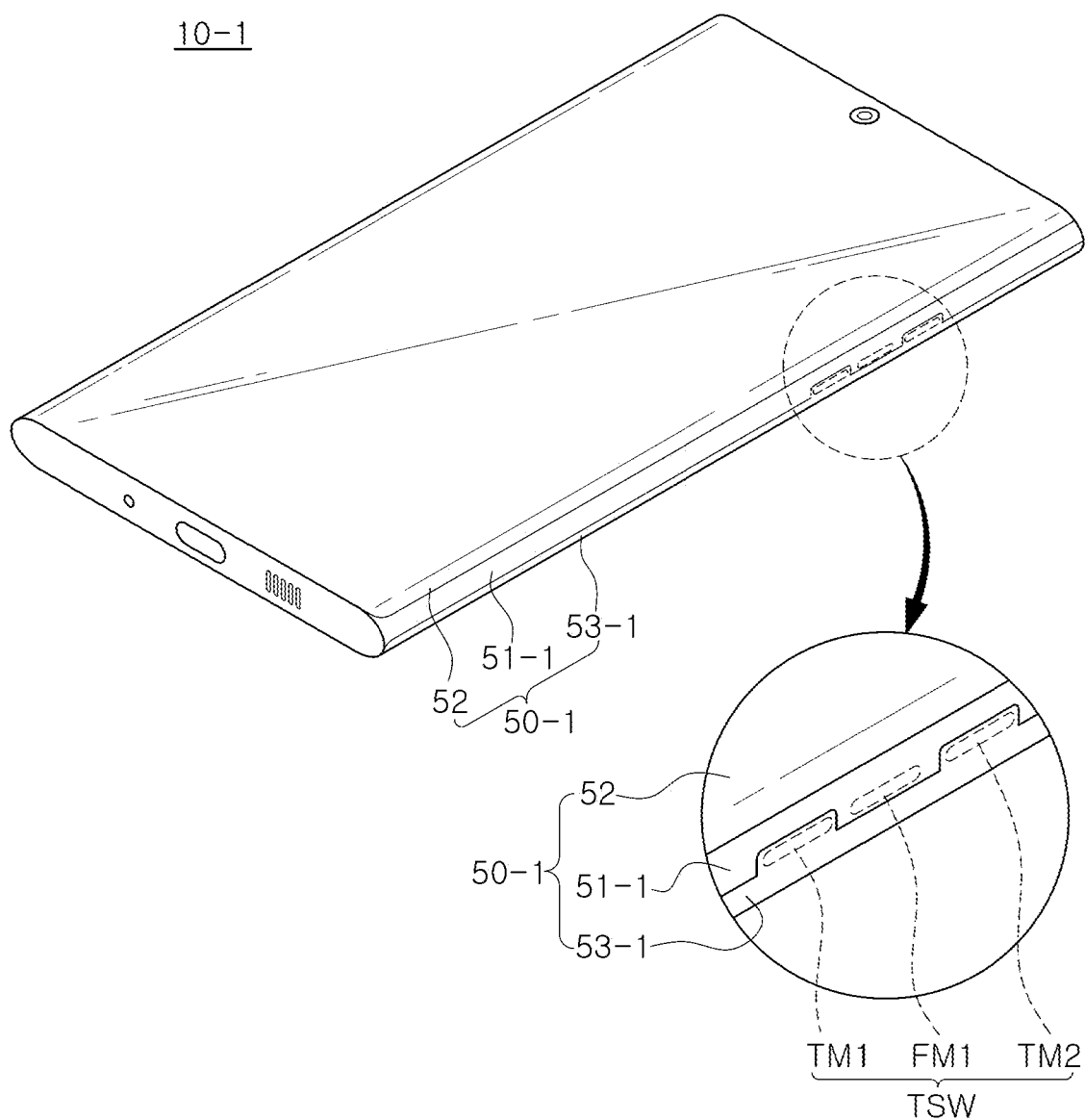
FIG. 2 is a perspective view illustrating an electronic apparatus, according to an example.

FIG. 1 is a perspective view illustrating an electronic apparatus 10, according to an example. FIG. 2 is a perspective view illustrating an electronic apparatus 10-1, according to an example.

Referring to FIG. 1, the electronic apparatus 10 may include a frame 51, a glass 52, a cover 53, and a touch switch unit TSW.

The frame 51 may be a metal frame constituting a central framework of the electronic apparatus 10. The glass 52 may be a front display glass disposed on a front surface of the frame 51, which forms one side of the frame 51. The cover 53 may be a non-conductor disposed on a rear surface of the frame 51, which forms another side of the frame 51. For example, a material of the cover 53 may be glass or plastic, but is not limited to being formed of glass or plastic.

As an example, the electronic apparatus 10 may include a side portion 50 having a three-layer structure including the glass 52, the frame 51, and the cover 53.

For example, referring to FIG. 1, the electronic apparatus 10 may be a mobile phone having a structure in which the frame 51 is disposed in a center of the electronic apparatus 10, the glass 52 is disposed on a front surface of the electronic apparatus 10, which forms an upper portion of the electronic apparatus 10, and the cover 53 may be disposed on a rear surface of the electronic apparatus 10, which is a lower portion of the electronic apparatus 10.

As another example, the side portion of the electronic apparatus 10 may have a double-layer structure including the frame 51 and the cover 53. In this case, the frame 51 may be disposed in a center of the electronic apparatus 10 and the cover 53 may be disposed on a rear surface of the electronic apparatus 10, which is a lower portion of the electronic apparatus 10.

The touch switch unit TSW may include a first touch member TM1, a first force member FM1, and a second touch member TM2, disposed on the side portion of the electronic apparatus 10, to replace a mechanical button.

As an example, the first touch member TM1 and the second touch member TM2 may be a portion of the cover 53, and the first force member FM1 may be a portion of the frame 51.

Referring to FIG. 1, boundaries between the glass 52, the frame 51, and the cover 53 are manufactured and assembled in linear form, so that the first touch member TM1, the first force member FM1, and the second touch member TM2 may be disposed in, for example, zigzag form, as illustrated in FIG. 1, rather than linear form.

As an example, referring to FIG. 2, the electronic apparatus 10-1 may have a side portion 50-1 including a frame 51-1, the glass 52, and a cover 53-1. In the electronic apparatus 10-1, the first touch member TM1, the first force member FM1, and the second touch member TM2 may be disposed on a substantially straight line by forming a bent portion in a portion of the frame 51-1 or the cover 53-1 to locate the first and second touch members TM1 and TM2 in the bent portion. The bent portion is provided to locate the first touch member TM1, the first force member FM1, and the second touch member TM2, and a shape or a size of the bent portion is not limited to the above example.

For example, referring to FIGS. 1 and 2, the electronic apparatuses 10 and 10-1 may each be a portable device, such as a smartphone, or a wearable device, such as a smartwatch. The electronic apparatuses 10 and 10-1 are not limited to specific devices, and may be portable or wearable electronic apparatuses or electronic apparatuses having switches for controlling an operation.

In the description herein, a touch may include a touch corresponding to a contact (for example, a contact touch), a touch corresponding to pressing (for example, a pressing touch), or a touch occurring in proximity to a touch member (for example, a proximity touch). The term "contact (or touch contact)" refers to a simple contact without an accompanying pressing force, and the term "press (or pressing touch)" refers to pressing force subsequent to the contact. In addition, the term "proximity touch" refers to an event including a contact as well as a contact occurring in proximity to a location in which touch sensing is possible. Therefore, in the following description, a touch may include a contact, force (pressing force), and a proximity touch unless a contact touch, a pressing touch, or a proximity touch is otherwise specified, or may include any one of the contact, the pressing force, and the proximity touch.

In FIGS. 1 and 2, for example, a touch member and a force member according to each example, such as the first touch member TM1, the first force member FM1, and the second touch member TM2, may not be exposed to an external entity. For example, each touch member and force member may have a structure invisible to the naked eye from an external entity through various passivation treatments.

In FIGS. 1 and 2, three members including two first and second touch members TM1 and TM2 and one first force member FM1 are illustrated, but the disclosure herein is not limited to the three members.

In an example, a touch sensing device including one or more touch members and one or more force members may be implemented.

In addition, since a touch sensing device according to the disclosure herein has a structure in which sensing electrodes SE1 and SE2 are disposed inside the cover 53/53-1, which is constructed of a nonconductive material such as glass, difficulty in identifying a plurality of touch switches on a metal case may be addressed, unlike the case in which a plurality of touch sensors are disposed inside an existing metal case.

When describing examples in the drawings of the present disclosure, repeated descriptions may be omitted for components having the same reference numeral and the same function, while only differences may be described.

Figure 3:
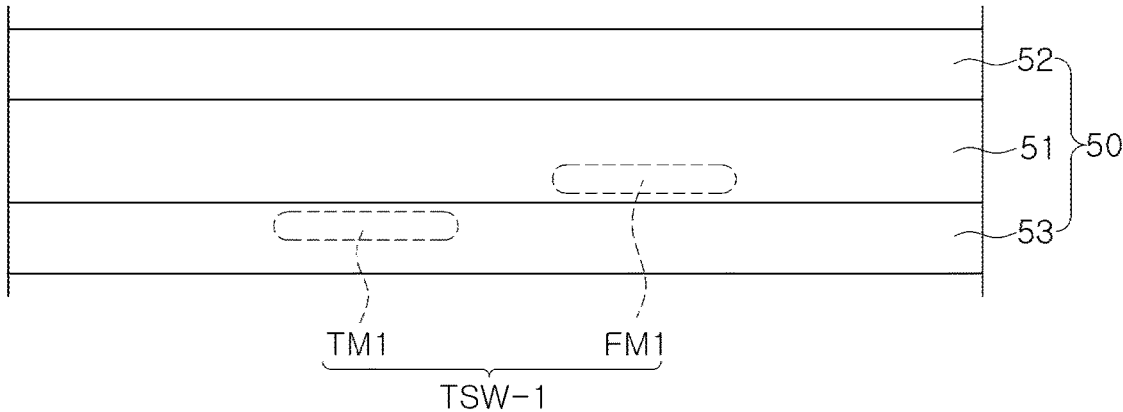
FIG. 3 is a front view illustrating a side portion of an electronic apparatus, according to an example.
Figure 4:
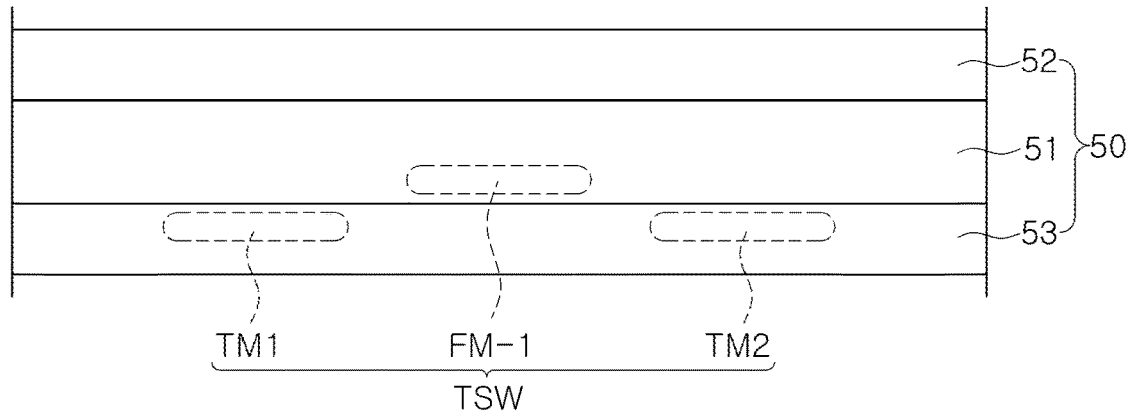
FIG. 4 is a front view illustrating a side portion of an electronic apparatus, according to an example.

FIG. 3 is a front view illustrating a side portion of an electronic apparatus 10-2, according to an example. FIG. 4 is a front view illustrating a side portion of an electronic apparatus 10-3, according to an example.

Referring to FIGS. 3 and 4, a boundary between the frame 51 and the cover 53 may be configured in a linear form.

Referring to FIG. 3, a touch switch unit TSW-1 may include the first touch member TM1 and the first force member FM1 disposed in zigzag form, rather than linear form.

Referring to FIG. 4, the first touch member TM1, the first force member FM1, and the second touch member TM2 may be disposed in a zigzag form, rather than linear form.

Figure 5:
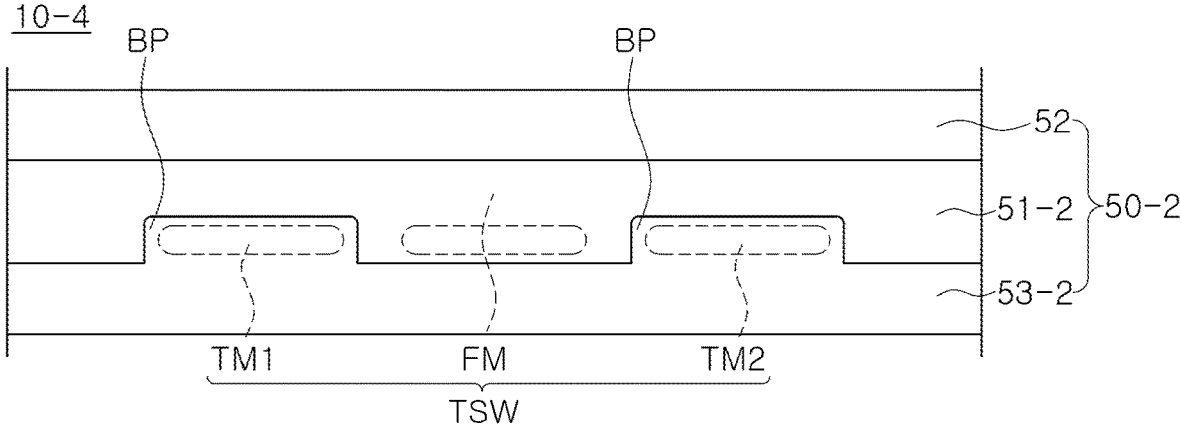
FIG. 5 is a front view illustrating a side portion of an electronic apparatus, according to an example.

FIG. 5 is a front view illustrating a side portion of an electronic apparatus 10-4, according to an example.

Referring to FIG. 5, in either one of the frame 51-2 and a cover 53-2, a bent portion BP may be formed in two points. Thus, the frame 51-2 and the cover 53-2 may be manufactured such that a boundary therebetween has a zigzag form, and the first touch member TM1, the first force member FM1, and the second touch member TM2 may be disposed in linear form.

Referring to FIGS. 3, 4, and 5, the side portion 50/50-1 of the electronic apparatus 10-2/10-3/10-4 has a triple-layer structure including the glass 52, the frame 51/51-2, and the cover 53/53-2. Referring to FIGS. 4 and 5, the first touch member TM1, the first force member FM1, and the second touch member TM2 may be disposed on the side portion 50/50-2 of the electronic apparatus 10-2/10-3/10-4 in order for the touch switch unit TSW to replace mechanical buttons. The first touch member TM1 and the second touch member TM2 may be a portion of the cover 53/53-2, and the first force member FM may be a portion of the frame 51/51-2. In FIGS. 3 to 5, the first touch member TM1, the first force member FM1, and the second touch member TM2 are illustrated as examples, but the touch switch unit TSW is not limited to the first touch member TM1, the first force member FM1, and the second touch member TM2.

As an example, an additional touch member may be a portion of the cover 53/53-1, and an additional force member may be a portion of the frame 51/51-2.

In the disclosure herein, since the first touch member TM1, the second touch member TM2, and the first force member FM1 may be disposed in any locations as long as they recognize a touch (a contact or a pressing touch) when touched (contacted or pressed) by a human (for example, a human hand), locations of the first touch member TM1, the second touch member TM2, and the first force member FM1 are not necessarily limited to the example illustrated in FIGS. 3 to 5.

In the case of an electronic apparatus such as a general mobile phone, a volume button or a power button may be formed as a physical button (key) on a side portion 50/50-2 thereof. In this case, a physical button should protrude so that a human hand may press the physical button. However, when a physical button is used, the physical button has limited endurance period due to physical wear, or the like. In addition, the protruding shape of the physical button may make it difficult to perform a waterproofing treatment and may result in aesthetic untidiness.

Hereinafter, touch sensing devices and electronic apparatuses proposed to address the above issues, according to examples, will be described with reference to FIGS. 6 to 14.

Figure 6:
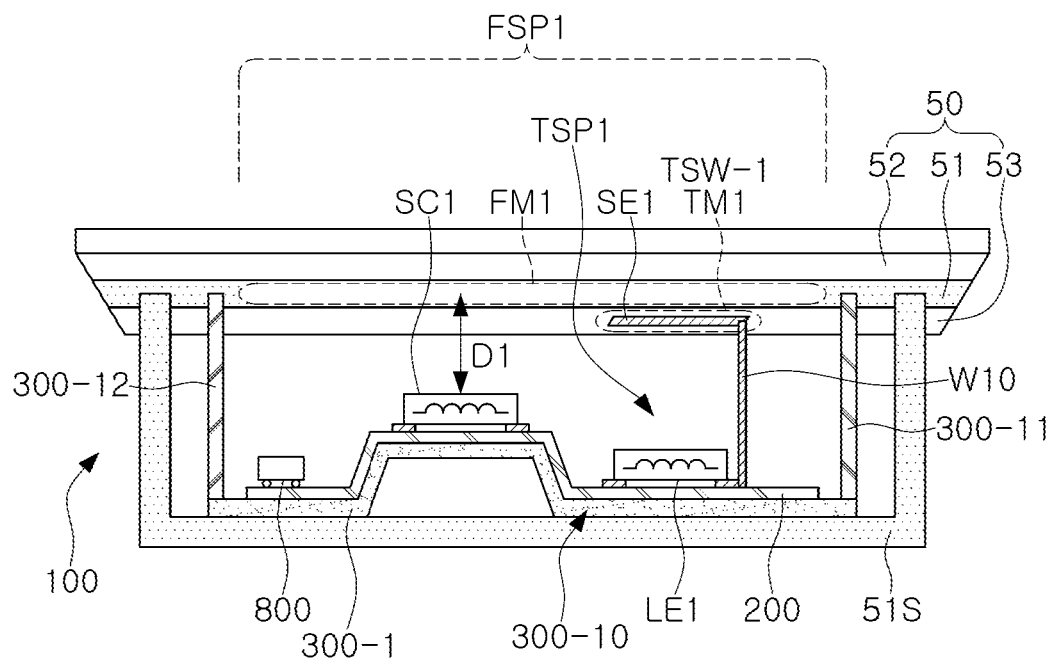
FIG. 6 is a cross-sectional view illustrating an internal structure of an electronic apparatus, according to an example.
Figure 6:
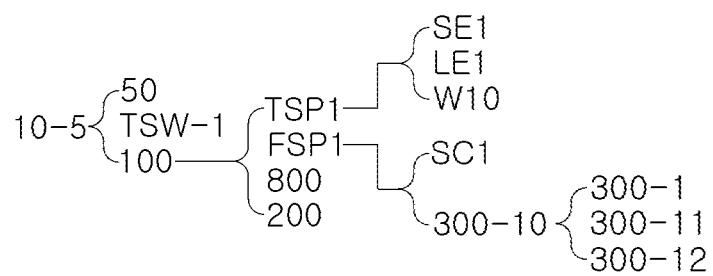

FIG. 6 is a cross-sectional view illustrating an internal structure of an electronic apparatus 10-5, according to an example.

Referring to FIG. 6, the electronic device 10-5 may include, for example, the side portion 50 including the frame 51 and the cover 53, a touch switch unit TSW-1 including the first touch member TM1 and the first force member FM1, and a touch sensing device 100 configured to detect a touch through the touch switch unit TSW-1.

The first touch member TM1 may be a portion of the cover 53 and may be formed of the same material as the cover 53. For example, when the cover 53 is formed of glass, the first touch member TM1 may also be formed of glass.

The first force member FM1 may be a portion of the frame 51 and may be formed of the same material as the frame 51. For example, when the frame 51 is formed of a metal, the first force member FM1 may also be formed of a metal.

The touch sensing device 100 may include a first touch sensing unit TSP1, a first force sensing unit FSP1, and a circuit unit 800.

As an example, the first touch sensing unit TSP1 may include a first sensing electrode SE1 and a first sensing inductor LE1 disposed inside the cover 53 and electrically connected to each other. Therefore, when a touch (for example, a contact) of a human body 1 (see FIG. 10) is applied through the cover 53, parasitic capacitance between the first sensing electrode SE1 and the human body 1 may be formed according to the touch (for example, the contact) to vary overall capacitance including the parasitic capacitance.

As an example, the first force sensing unit FSP1 may include a first sensing coil SC1 spaced apart from an internal side surface of the frame 51 by a predetermined distance (for example, D1). Therefore, when a touch (for example, a pressing touch) is applied through the frame 51, inductance may vary depending on a change in the distance between the first sensing coil SC1 and the frame 51 according to the touch (for example, the pressing touch). When the distance between the first sensing coil SC1 and the frame 51 is changed by the pressing touch while current flows through the first sensing coil SC1, inductance is changed (for example, decreased) by an action of eddy current generated by the change in the distance and a resonant frequency based on the inductance may be increased.

As an example, the circuit unit 800 may detect whether a touch of the human body 1 is input, based on the variable capacitance formed by the first touch sensing unit TSP1 and the inductance formed by the first force sensing unit FSP1.

For example, the first touch sensing unit TSP1 may include the first sensing electrode SE1, the first sensing inductor LE1, and a first connecting wire W10 disposed inside the first touch member TM1.

The first touch member TM1 may be a portion of the cover 53, which is formed of a nonconductive material, and may be formed of, for example, a nonconductive material such as glass or plastic.

The first sensing electrode SE1 may be disposed inside the first touch member TM1, which is a portion of the cover 53.

The first sensing inductor LE1 may be electrically connected to the first sensing electrode SE1, and may be mounted on a substrate 200.

The first connection wire W10 may electrically connect the first sensing electrode SE1 and one end of the first sensing inductor LE1 to each other.

For example, the first force sensing unit FSP1 may include the first force member FM1, the first sensing coil SC1, and a first support member 300-10.

The first force member FM1 may be a portion of the frame 51, which is formed of a conductor, and may be formed of, for example, a conductor such as a metal.

As an example, the first sensing coil SC1 may be spaced apart from the first force member FM1 by a predetermined distance (for example, D1) and may be mounted on the substrate 200 to oppose an internal side surface of the first force member FM1.

As an example, the first support member 300-10 may include a first body member 300-1 and first column members 300-11 and 300-12.

The first body member 300-1 may be supported by an internal structure 51S of the frame 51, and may support the substrate 200 on which the first sensing coil SC1 is mounted.

The first column members 300-11 and 300-12 are supported by the first body member 300-1, and may be attached to both ends of the first force member FM1 of the frame 51.

When a touch (for example, a pressing touch) through the first force member FM1 is not applied due to the first support member 300-10, the predetermined distance (for example, D1) between the first force member FM1 and the first sensing coil SC1 may be maintained. When a touch (for example, a pressing touch) through the first force member FM1 is applied, the first force member FM1 may be inwardly deflected.

In addition, the touch sensing device 100 may include the circuit unit 800 mounted on one surface or the other surface of the substrate 200, a capacitor element, and the like. The circuit unit 800 may include an oscillation circuit connected to each of the sensing electrodes SE1 and SE2 through the substrate 200, and a touch identification circuit configured to detect a location of an applied touch (contact or pressing touch). The oscillation circuit and the touch identification circuit will be described in more detail below.

For example, when a pressing touch is applied to the first force member FM1, the first force member FM1 may be inwardly deflected to change a distance between the frame 51 and the corresponding sensing coil SC1. Such a change in distance may lead to a change in inductance. According to such an action, inductive sensing depending on a pressing touch may be performed.

In addition, the first and second touch members TM1 and TM2, which are disposed on two opposing sides of the first force member FM1, are disposed on the cover 53 to form parasitic capacitance between a human body (for example, a human hand) and the first sensing electrode SE1 when a contact of the human body occurs. Such formation of the parasitic capacitance may lead to a change in capacitance. According to such an action, capacitive sensing depending on the contact may be performed.

When the human body presses the frame 51, the frame 51 may be inwardly deflected to change inductance, and thus, a force operation (a touch operation performed by a pressing touch) may be performed. When the human body (for example, the human hand) contacts the cover 53, parasitic capacitance may be formed between the first sensing electrode SE1 and the human body to change capacitance, and thus, a touch operation (a touch operation performed by a contact) may be performed.

Accordingly, in a touch in this disclosure, the human body (for example, the human hand) may simultaneously touch the frame 51 and the cover 53.

The first force member FM1 may be a region of the frame 51 disposed between two points supported by the first column members 300-11 and 300-12. Such a definition of the first force member FM1 may be applied to each example herein.

Figure 7:
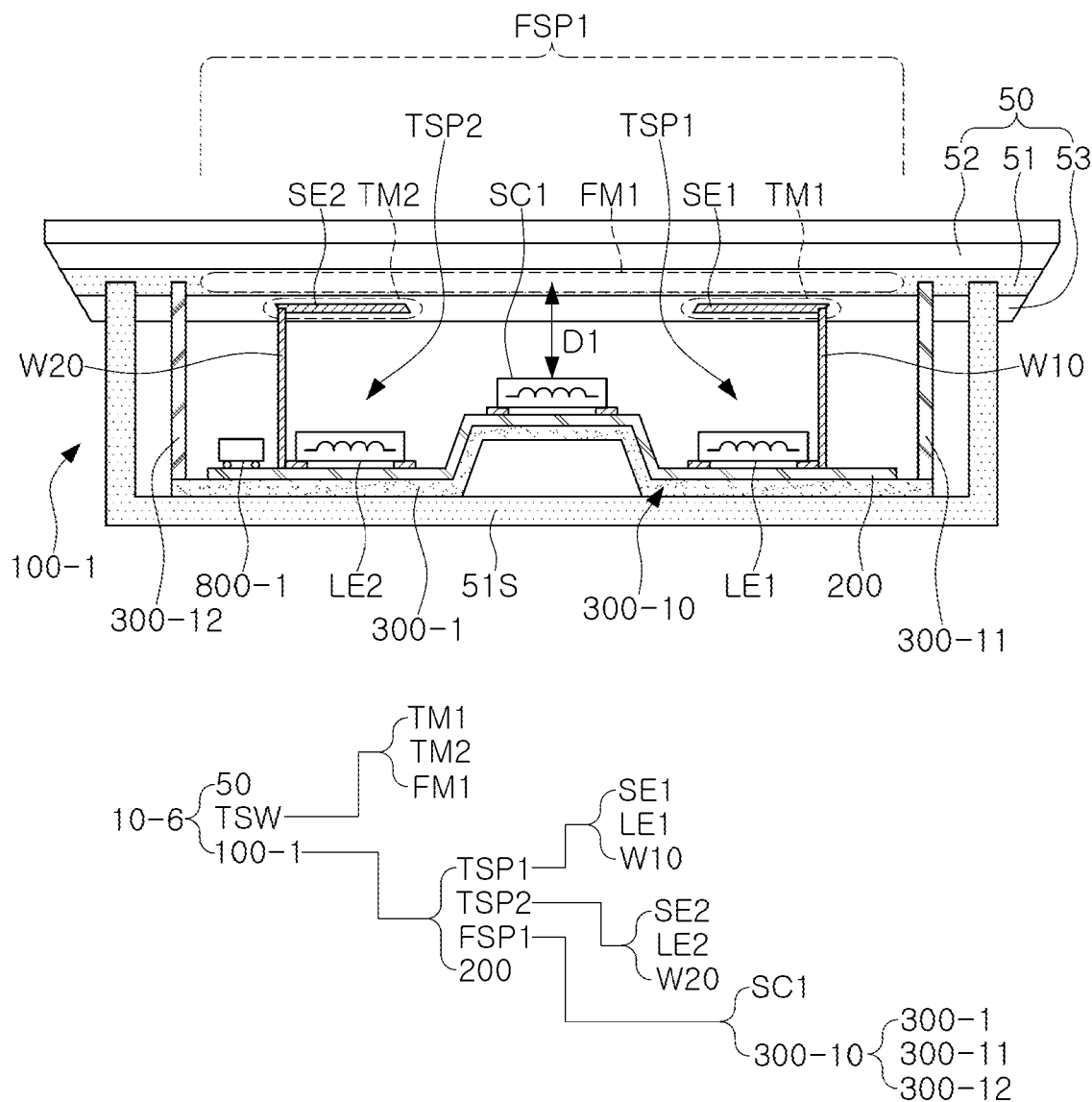
FIG. 7 is a cross-sectional view illustrating an internal structure of an electronic apparatus, according to an example.

FIG. 7 is a cross-sectional view illustrating an internal structure of an electronic apparatus 10-6, according to an example.

Referring to FIG. 7, the electronic device 10-6 may include the side portion 50 including the frame 51 and the cover 53, the touch switch unit TSW including the first touch member TM1, the first force member FM1, and the second touch member TM2, and a touch sensing device 100-1 configured to detect a touch through the touch switch unit TSW.

The touch sensing device 100-1 has a structure in which a second touch sensing unit TSP2 is added to the structure of the touch sensing device 100 in FIG. 6, and further includes a circuit unit 800-1 configured to detect whether a touch of the human body 1 is input, based on the variable capacitance formed by the first touch sensing unit TSP1, a variable capacitance formed by the second touch sensing unit TSP2, and the inductance formed by the first force sensing unit FSP1.

Referring to FIG. 7, the second touch sensing unit TSP2 may be disposed inside the cover 53 and may include a second sensing electrode SE2 and a second sensing inductor LE2 electrically connected to each other. Therefore, when a touch (for example, a contact) of the human body 1 is applied through the cover 53, parasitic capacitance may be formed between a second sensing electrode SE2 and the human body 1 according to the touch (for example, the contact) and overall capacitance including the parasitic capacitance may be varied.

For example, the second touch sensing unit TSP2 may include the second sensing electrode SE2, the second sensing inductor LE2, and a second connection wire W20 disposed inside the second touch member TM2.

The second touch member TM2 may be a portion of the cover 53 and may be formed of, for example, a nonconductive material such as glass or plastic.

The second sensing electrode SE2 may be disposed inside the second touch member TM2, which is a portion of the cover 53.

The second sensing inductor LE2 may be electrically connected to the second sensing electrode SE2 and may be mounted on the substrate 200.

The second connection wire W20 may electrically connect the second sensing electrode SE2 and one of the second sensing inductor LE2 to each other.

In this disclosure, the first and second connection wires W10 and W20 may be conductor wires or conductor lines formed on a flexible printed circuit board (FPCB). The first and second connection wires W10 and W20 are not limited to these examples, and may be any conductor lines as long as they electrically connect the first sensing electrode SE1 and the first sensing inductor LE1 to each other and connect the second sensing electrode SE2 and the second sensing inductor LE2 to each other.

In addition, as a corresponding sensing electrode and a corresponding sensing inductor are connected through a connection wire such as the first and second connection wires W10 and W20, a location in which the sensing inductor is disposed is not necessarily limited. Therefore, the location in which the sensing inductor is disposed may be freely determined.

To give an additional description, as illustrated in FIGS. 1 and 2, the first force member FM1 may be disposed between the first and second touch members TM1 and TM2 but, as illustrated in FIG. 7, the first force member FM1 may have an area larger than an overall area of the first and second touch members TM1 and TM2.

The first and second touch members TM1 and TM2 are members configured to detect a contact and are members configured to detect a change in capacitance caused by capacitance formed by the human body 1 when a touch occurs. The first force member FM1 is a member configured to detect a force generated by force. When a force is applied, the frame 51 is deflected (e.g., metal deflection). Accordingly, a change in air gap between the frame 51 and the first sensing coil SC1 may occur. The first touch member TM1 is provided to detect a change in inductance caused by the change in air gap.

For example, when a human hand presses one of the first and second touch members TM1 and TM2 and the first force member FM1, touch sensing performed by human body contact ("capacitive sensing") and force sensing performed by applied force ("inductive sensing") may simultaneously operate. On the other hand, when something other than the human hand presses one of the first and second touch members TM1 and TM2 and the first force member FM1, touch sensing performed by a human body contact may not operate but force sensing may operate. Accordingly, since the corresponding operation may be performed to distinguish whether it is the human hand or not, a malfunction prevention function may be performed.

For example, in the embodiment illustrated in FIG. 7, the force operation occurs as a human hand contacts the frame 51 and force is applied to inwardly deflect the frame 51. The touch operation occurs due to parasitic capacitance formed between first and second sensing electrodes SE1 and SE2, disposed inside the cover 53, and the human body 1 when the human hand contacts the cover 53 rather than the frame 51.

The structure of the touch sensing device 100-1 may include two inductors LE1 and LE2 for a touch sensing operation and one first sensing coil SC1 for a force sensing operation. The two inductors LE1 and LE2 may be a first sensing inductor and a second sensing inductor, respectively. The touch sensing operation may be performed to sense an actual touch location, and the force sensing operation may be performed to check the touch sensing operation.

Hereinafter, an inductance change operation, applied to this disclosure, will be described. When a force is applied to the first force member FM1 of the frame 51, the first force member FM1 may be pressed to inwardly deflect the frame 51. Accordingly, the distance D1 between the frame 51 and the first sensing coil SC1 may be changed. In addition, while current flows through the first sensing coil SC1, a distance to the frame 51, which is a neighboring conductor, may be changed to generate eddy current. Due to the eddy current, inductance may be changed (for example, decreased). Thus, a resonant frequency may be changed (for example, increased) to detect a force applied based on the change in the resonant frequency.

Figure 8:
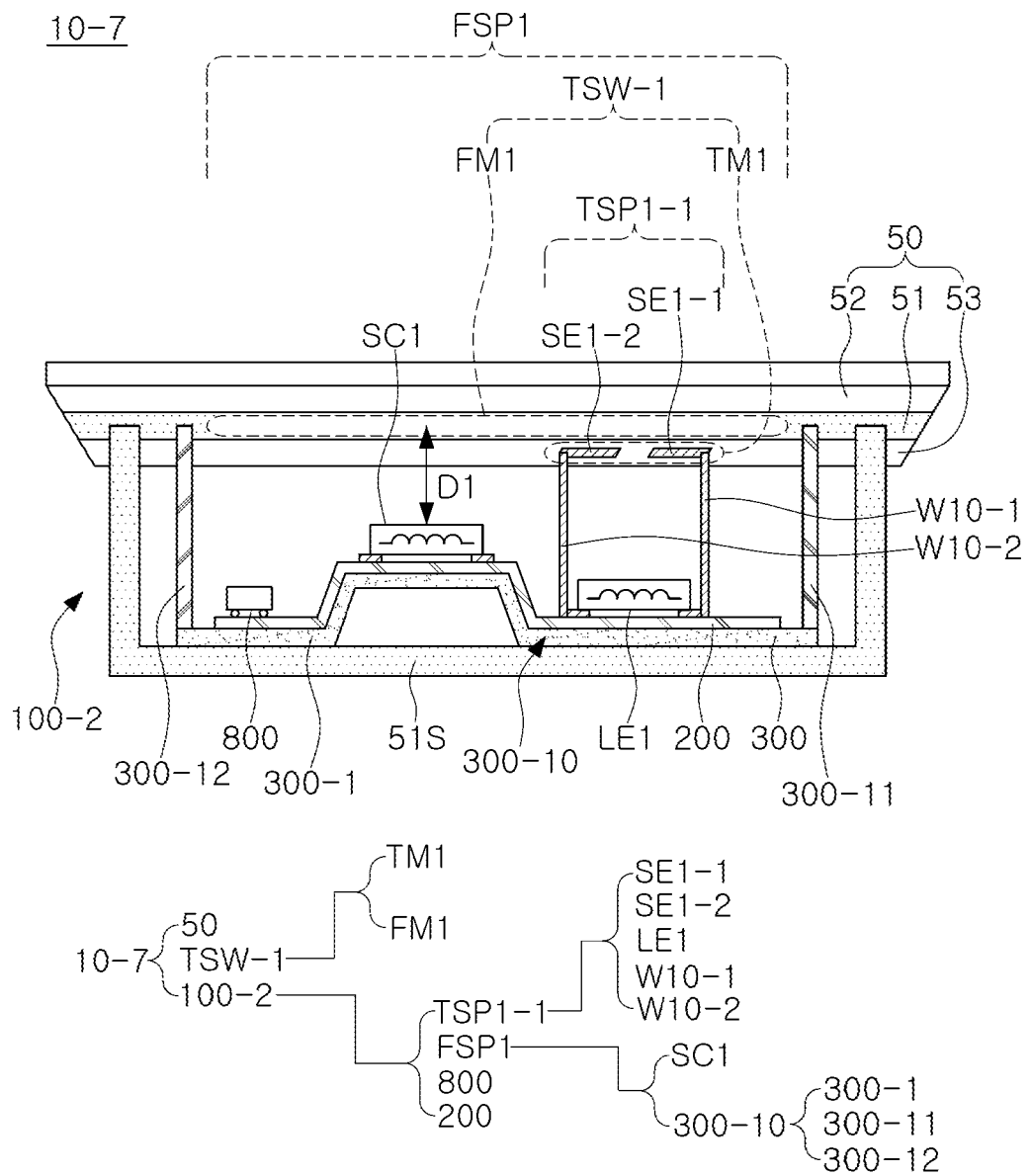
FIG. 8 is a cross-sectional view illustrating an internal structure of an electronic apparatus, according to an example.

FIG. 8 is a cross-sectional view illustrating an internal structure of an electronic apparatus 10-7, which is a modified version of the electronic apparatus 10-5 in FIG. 6.

Referring to FIG. 8, the electronic apparatus 10-7 may include the side portion 50 including the frame 51, the glass 52, and the cover 53, the touch switch unit TSW-1 including the first touch member TM1 and the first force member FM1, and a touch sensing device 100-2 configured to detect a touch through the touch switch unit TSW.

The touch sensing device 100-2 may include a first touch sensing unit TSP1-1 including two first sensing electrodes SE1-1 and SE1-2, which are a modified form of the first sensing electrode SE1 in FIG. 7.

As an example, the two first sensing electrodes SE1-1 and SE1-2 are disposed in different locations of the inside of the first touch member TM1, which is a portion of the cover 53. Of the two first sensing electrodes SE1-1 and SE1-2, one first sensing electrode SE1-1 may be connected to one end of the first sensing inductor LE1 and the other sensing electrode SE1-2 may be connected to the other end of the first sensing inductor LE1.

The first touch sensing unit TSP1-1 may include two first connection wires W10-1 and W10-2. Of the two first connection wires W10-1 and W10-2, one first connection wire W10-1 may electrically connect the first sensing electrode SE1-1 and one end of the first sensing inductor LE1 to each other, and the other first connection wire W10-2 may electrically connect the first sensing electrode SE1-2 and the other end of the first sensing inductor LE1 to each other.

Figure 9:
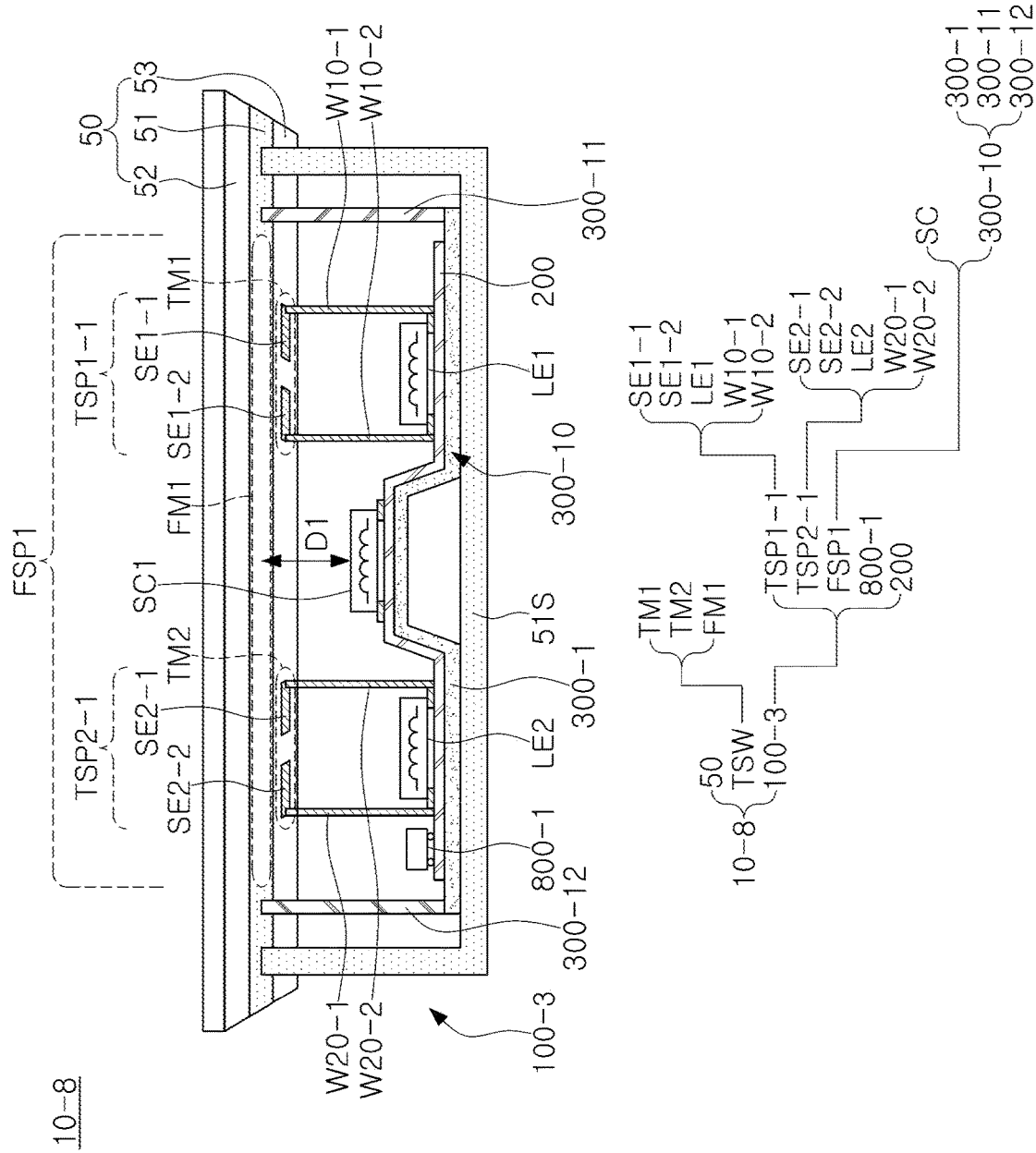
FIG. 9 is a cross-sectional view illustrating an internal structure of an electronic apparatus, according to an example.

FIG. 9 is a cross-sectional view illustrating an internal structure of an electronic apparatus 10-8, which is a modified version of the electronic apparatus 10-6 in FIG. 7.

Referring to FIG. 9, the electronic apparatus 10-8 may include the side portion 50 including the frame 51, the glass 52, and the cover 53, the touch switch unit TSW including the first touch member TM1, the second touch member TM2, and the first force member FM1, and a touch sensing device 100-3 configured to detect a touch through the touch switch unit TSW.

The touch sensing device 100-3 may include the first touch sensing unit TSP1-1 including the two first sensing electrodes SE1-1 and SE1-2. The touch sensing device 100-3 may further include a second touch sensing unit TSP2-1 including two second sensing electrodes SE2-1 and SE2-2, which are a modified form of the second sensing electrode SE2 in FIG. 7.

As an example, the two first sensing electrodes SE1-1 and SE1-2 may be disposed in different locations of the inside of the first touch member TM1, which is a portion of the cover 53. Of the two first sensing electrodes SE1-1 and SE1-2, one first sensing electrode SE1-1 may be connected to one end of the first sensing inductor LE1, and the other first sensing electrode SE1-2 may be connected to the other end of the first sensing inductor LE1.

In addition, the two second sensing electrodes SE2-1 and SE2-2 may be disposed in different locations of the inside of the second touch member TM2, which is a portion of the cover 53. Of the two second sensing electrodes SE2-1 and SE2-2, one second sensing electrode SE2-1 may be connected to one end of the second sensing inductor LE2, and the other second sensing electrode SE2-2 may be connected to the other end of the second sensing inductor LE2.

The first touch sensing unit TSP1-1 may include the two first connection wires W10-1 and W10-2. Of the two first connection wires W10-1 and W10-2, one first connection wire W10-1 may electrically connect the first sensing electrode SE1-1 and one end of the first sensing inductor LE1 to each other, and the other first connection wire W10-2 may electrically connect the first sensing electrode SE1-2 and the other end of the first sensing inductor LE1 to each other.

The second touch sensing unit TSP2-1 may include two second connection wires W20-1 and W20-2. As an example, of the two second connection wires W20-1 and W20-2, one second connection wire W20-1 may electrically connect the second sensing electrode SE2-1 and one end of the second sensing inductor LE2 to each other, and the other second connection wire W20-2 may electrically connect the second sensing electrode SE2-2 and the other end of the second sensing inductor LE1 to each other.

In the touch sensing devices 100, 100-1, 100-2, and 100-3 illustrated in FIGS. 6 to 9, the first and second touch sensing units TSP1/TSP1-1 and TSP2/TSP2-1 may operate to sense a touch location, and the first force sensing unit FSP1 may operate to check an error for touch sensing.

Figure 10:
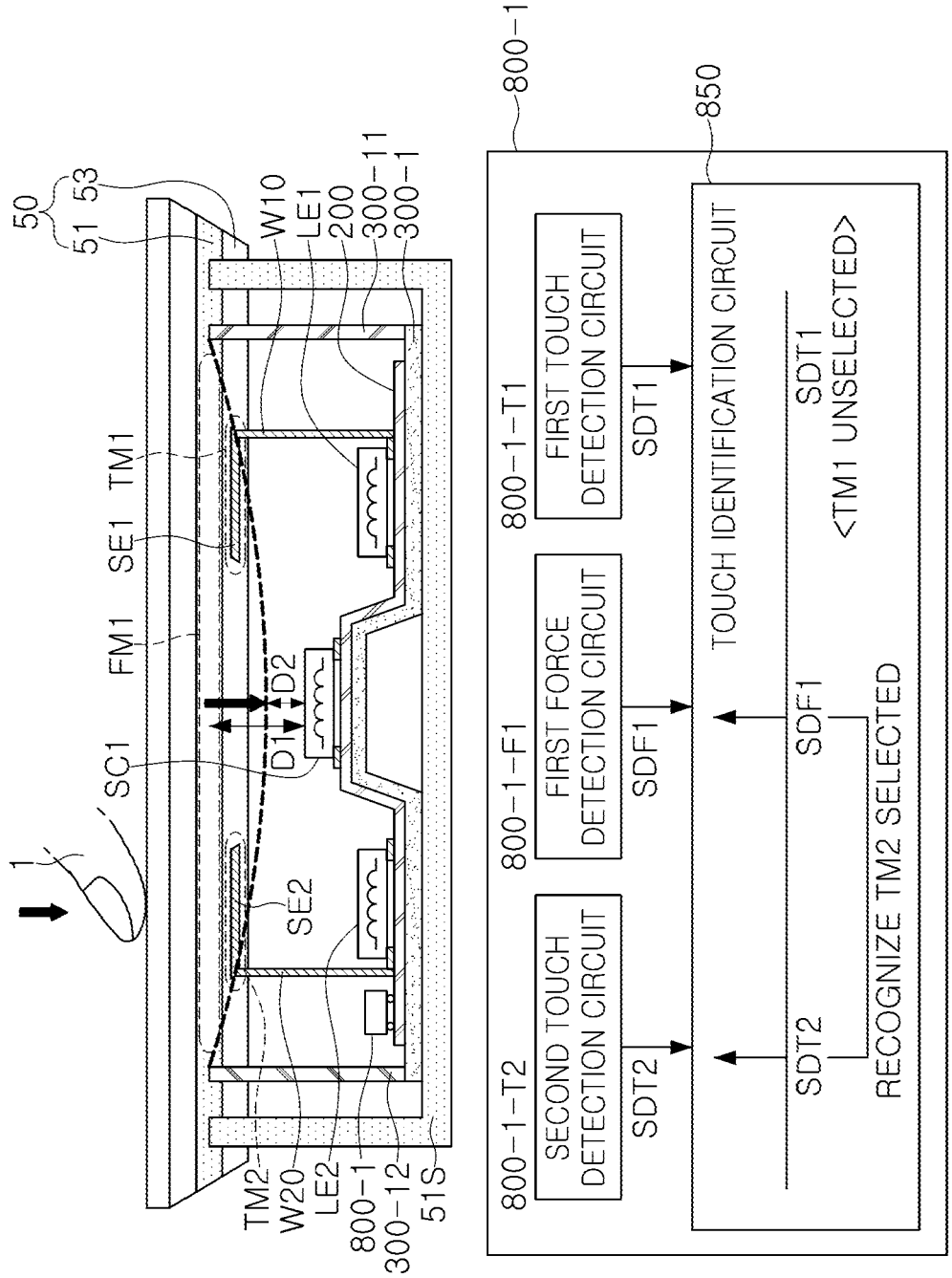
FIG. 10 is a view illustrating an operation of the electronic apparatus of FIG. 7, according to an example.

FIG. 10 is a view illustrating an operation of the electronic apparatus 10-6 in FIG. 7.

Referring to FIGS. 7 and 10, the circuit unit 800-1 includes a first touch detection circuit 800-1-T1, a first force detection circuit 800-1-F1, a second touch detection circuit 800-1-T2, and a touch identification circuit 850.

As an example, the first touch detection circuit 800-1-T1 may output a first touch detection signal SDT1 for the first touch member TM1 based on a change in capacitance depending on parasitic capacitance formed between a human body and the first sensing electrode SE1 when a touch (for example, a contact) of the human body 1 occurs through the first touch member TM1.

The first force detection circuit 800-1-F1 may output a first force detection signal SDF1 for the first force member FM1 based on a change in inductance occurring as the first force member FM1 is inwardly deflected when a touch (a pressing touch) occurs through the first force member FM1.

The second touch detection circuit 800-1-T2 may output a second touch detection signal SDT2 for the second touch member TM2 based on a change in capacitance depending on parasitic capacitance formed between the human body 1 and the second sensing electrode SE2 when a touch (for example, a contact) of the human body occurs through the second touch member TM2.

The touch identification circuit 850 may identify a touch switch based on the first touch detection signal SDT1, the first force detection signal SDF1, and the second touch detection signal SDT2.

For example, when the human body 1 (for example, a human hand) touches (contacts and presses) the first force member FM1 and the second touch member TM2, parasitic capacitance may be formed between the second touch member TM2 and the human body 1, and, thus, the second touch detection circuit 800-1-T2 may output the second touch detection signal SDT2.

At the same time, when the first force member FM1 is pressed to change a distance between the first force member FM1 and the first sensing coil SC1 (D1→D2), the distance between the first force member FM1 and the first sensing coil SC1 may be changed to generate eddy current. Accordingly, as described above, overall inductance varies depending on an action of the eddy current. As a result, the first force detection circuit 800-1-F1 may output the first force detection signal SDF1.

Therefore, the touch identification circuit 850 may recognize that the second touch member TM2 was touched, based on the second touch detection signal SDT2 and the first force detection signal SDF1.

In contrast, when the human body 1 (for example, a human hand) touches (contacts and presses) the first force member FM1 and the first touch member TM1, the touch identification circuit 850 may recognize that the first touch member TM1 was touched, based on the touch detection signal SDT1 and the first force detection signal SDF1, through the above-described operation.

Figure 11:
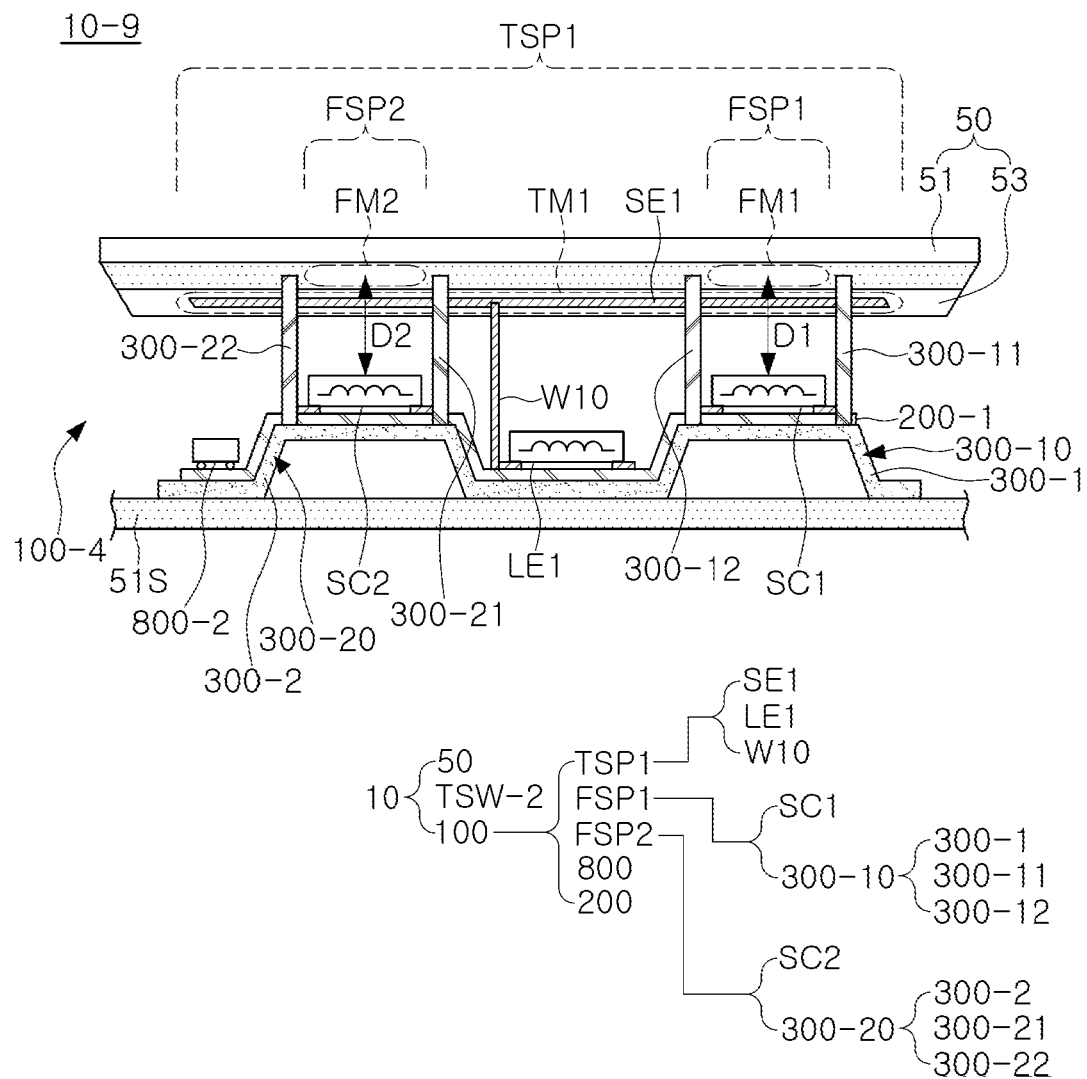
FIG. 11 is a cross-sectional view illustrating an internal structure of an electronic apparatus, according to an example.

FIG. 11 is a cross-sectional view illustrating an internal structure of an electronic apparatus 10-9, according to an example.

Referring to FIG. 11, the electronic apparatus 10-9 may include the side portion 50 including the frame 51 and the cover 53, a touch switch unit TSW-2 disposed on the side portion 50 and including the first force member FM1, the first touch member TM1, a second force member FM2, and a touch sensing device 100-4 configured to detect a touch through the touch switch unit TSW-2.

The touch sensing device 100-4 may include the first touch sensing unit TSP1, the first force sensing unit FSP1, a second force sensing unit FSP2, and a circuit unit 800-2.

The first touch member TM1 may be a portion of the cover 53, and the first force member FM1 and the second force member FM2 may be different portions of the frame 51.

The first touch sensing unit TSP1 may include the first sensing electrode SE1 and the first sensing inductor LE1 disposed inside the cover 53 and electrically connected to each other. Accordingly, when a touch (for example, a contact) of the human body 1 is applied through the first touch member TM1 of the cover 53, parasitic capacitance may be formed between the first sensing electrode SE1 and the human body 1 according to the touch (for example, the contact) to vary overall capacitance including the parasitic capacitance.

As an example, the first sensing electrode SE1 may be disposed on the entire internal side of the cover 53, opposing the first sensing coil SC1, a second sensing coil SC2, and the first sensing inductor LE1.

The first force sensing unit FSP1 includes the first sensing coil SC1, which is spaced apart from an internal side surface of the frame 51 by a predetermined distance. Accordingly, when a touch (for example, a pressing touch) is applied through the frame 51, inductance may vary depending on the change in the distance between the first sensing coil SC1 and the frame 51 according to the touch (for example, the pressing touch).

The second force sensing unit FSP2 may include the second sensing coil SC2, which is spaced apart from the internal side surface of the frame 51 by a predetermined distance. Accordingly, when a touch (for example, a pressing touch) is applied through the frame 51, inductance may vary depending on a change in the distance between the second sensing coil SC2 and the frame 51 according to the touch (for example, the pressing touch).

For example, the first touch sensing unit TSP1 may include the first sensing electrode SE1, the first sensing inductor LE1, and the first connection wire W10 disposed inside the first touch member TM1.

The first touch member TM1 may be a portion of the cover 53, and may be formed of a nonconductive material such as glass or plastic.

The first sensing electrode SE1 may be disposed inside the first touch member TM1.

The first sensing inductor LE1 may be electrically connected to the first sensing electrode SE1 and may be mounted on a substrate 200-1.

The first connection wire W10 may electrically connect the first sensing electrode SE1 and one end of the first sensing inductor LE1 to each other.

For example, the first force sensing unit FSP1 may include the first sensing coil SC1 and the first support member 300-10.

The first sensing coil SC1 may be spaced apart from an internal side surface of the first force member FM1 by a predetermined distance (for example, D1).

The first support member 300-10 may include the first body member 300-1 and the first column members 300-11 and 300-12.

The first body member 300-1 may be supported by the internal structure 51s of the frame 51, and may support a portion of the substrate 200-1 on which the first sensing coil SC1 is mounted.

The first column members 300-11 and 300-12 may be supported on the first body member 300-1 and may be attached to both ends of the first force member FM1. When a touch (for example, a pressing touch) is not applied through the first force member FM1 due to the first support member 300-10, a predetermined distance (for example, D1) from the first force member FM1 to the first sensing coil SC1 may be maintained. When a touch (for example, a pressing touch) is applied through the first force member FM1, the first force member FM1 may be inwardly deflected.

For example, the second force sensing unit FSP2 may include the second sensing coil SC2 and a second support member 300-20.

The second sensing coil SC2 may be spaced apart from an internal side surface of the second force member FM2, by a predetermined distance (for example, D2).

The second support member 300-20 may include a second body member 300-2 and second column members 300-21 and 300-22.

The second body member 300-2 may supported by the internal structure 51s of the frame 51, and may support a portion of the substrate 200-1 on which the second sensing coil SC2 is mounted.

The second column members 300-21 and 300-22 may be supported by the second body member 300-2, and may be attached to both ends of the second force member FM2. When a touch (for example, a pressing touch) is not applied through the second force member FM2 due to the second support member 300-20, a predetermined distance (for example, D2) from the second force member FM2 to the second sensing coil SC2 may be maintained. When a touch (for example, a pressing touch) is applied through the second force member FM2, the second force member FM2 may be inwardly deflected.

In the touch sensing device illustrated in FIG. 11, the first and second force sensing units FSP1 and FSP2 may operate to sense a touch position, and the first touch sensing unit TSP1 may operate to check an error for touch sensing.

Figure 12:
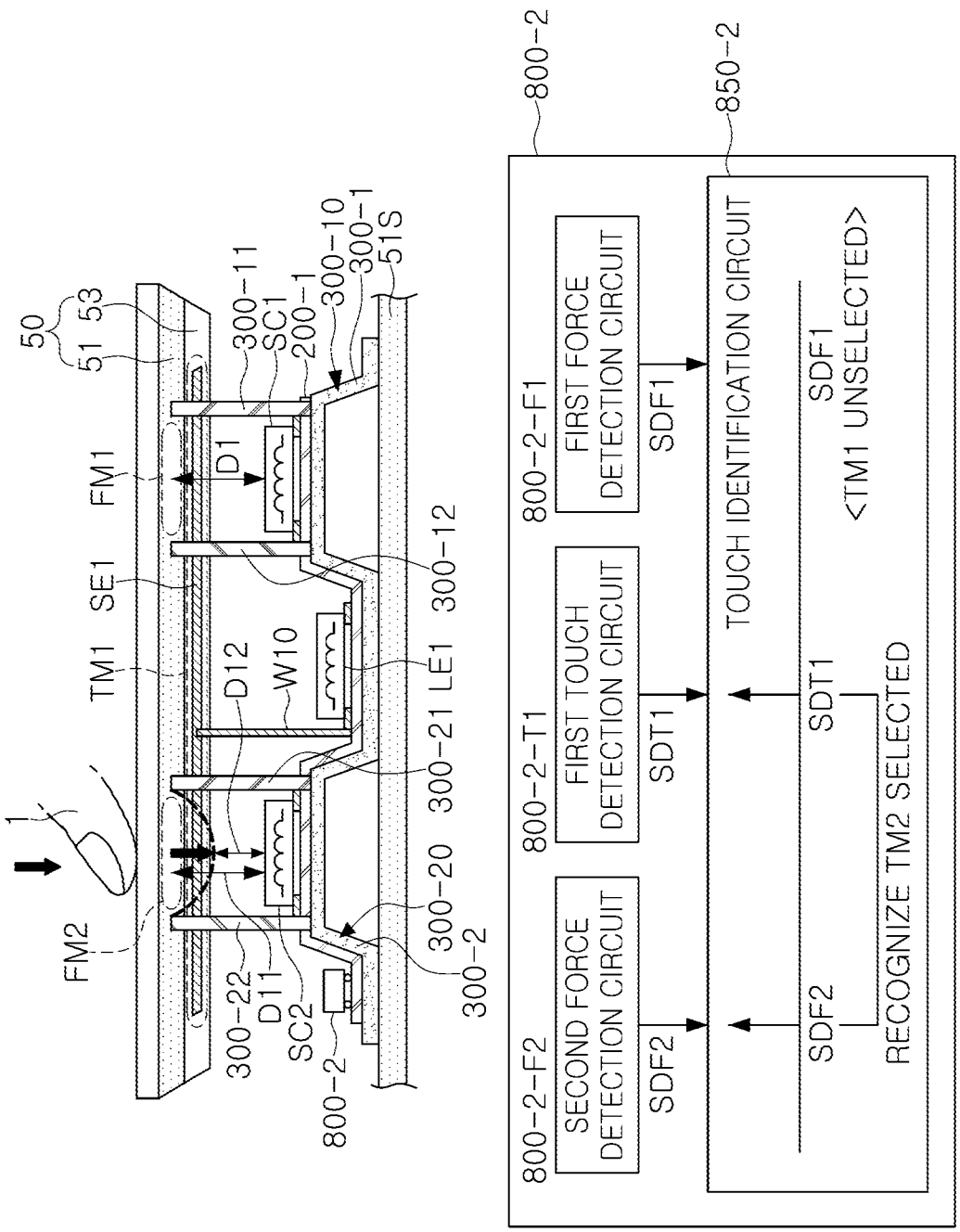
FIG. 12 is a view illustrating an operation of the electronic apparatus of FIG. 11, according to an example.

FIG. 12 is a view illustrating an operation of the electronic apparatus 10-9 in FIG. 11.

Referring to FIGS. 11 and 12, the circuit unit 800-2 may include a first force detection circuit 800-2-F1, a first touch detection circuit 800-2-T1, a second force detection circuit 800-F2), and a touch identification circuit 850-2.

The first force detection circuit 800-2-F1 may output a first force detection signal SDF1 for the first force member FM1, based on a change in inductance occurring as the first force member FM1 is inwardly deflected when a touch (for example, a pressing touch) occurs through the first force member FM1.

The first touch detection circuit 800-2-T1 may output a first touch detection signal SDT1 for the first touch member TM1, based on a change in capacitance depending on parasitic capacitance formed between the human body 1 and the first sensing electrode SE1 when a touch (for example, a pressing touch) of the human body 1 occurs through the first touch member TM1.

The second force detection circuit 800-2-F2 may output a second force detection signal SDF2 for the second force member FM2, based on a change in inductance occurring as the second force member FM2 is inwardly deflected when a touch (for example, a pressing touch) occurs through the second force member FM2.

The touch identification circuit 850-2 may identify a touch (for example, press) location, based on the first force detection signal SDF1, the first touch detection signal SDT1, and the second force detection signal SDF2.

For example, when the human body 1 (for example, a human hand) touches (contacts and presses) the second force member FM2 and the first touch member TM1, parasitic capacitance may be formed between the first touch member TM1 and the human body, and thus, the first touch detection circuit 800-2-T1 may output the first touch detection signal SDT1.

At the same time, when the second force member FM2 is pressed to change a distance between the second force member FM2 and the second sensing coil SC2 (D11→D12), a distance between the second sensing coil SC2 and the second force member FM2 may be changed to generate eddy current. Accordingly, as described above, overall inductance varies depending on an action of the eddy current. As a result, the second force detection circuit 800-2-F2 may output the second force detection signal SDF2.

Therefore, the touch identification circuit 850-2 may recognize that the second force member FM2 was touched, based on the first touch detection signal SDT1 and the second force detection signal SDF2. In contrast, when the human body 1 (for example, a human hand) touches (contacts and presses) the first force member FM1 and the first touch member TM1, the touch identification circuit 850 may recognize that the first force member TM1 was touched, based on the force detection signal SDF1 and the first touch detection signal SDT1, through the above-described operation.

Figure 13:
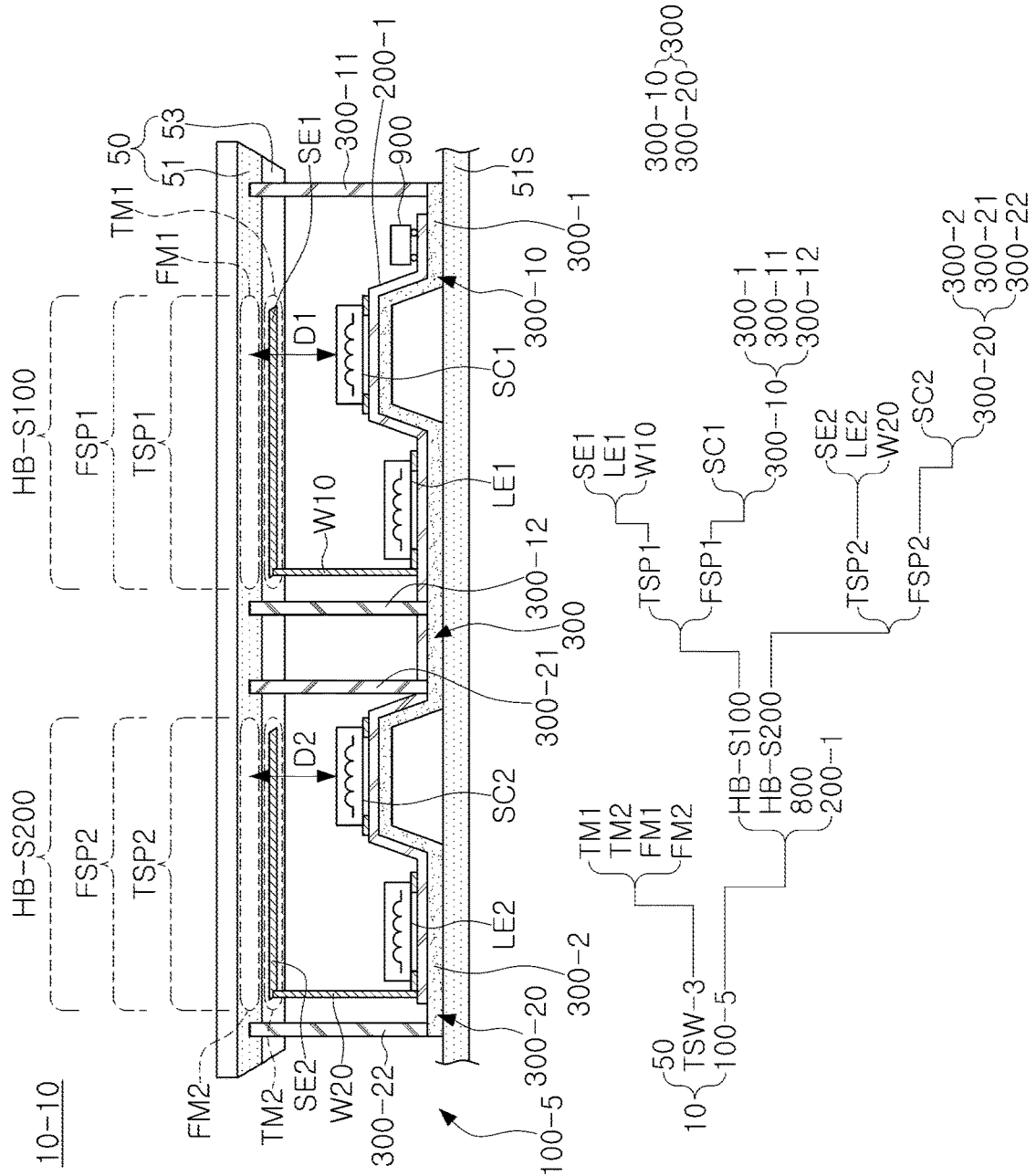
FIG. 13 is a cross-sectional view illustrating an internal structure of an electronic apparatus, according to an example.

FIG. 13 is a cross-sectional view illustrating an internal structure of an electronic apparatus 10-10, according to an example.

Referring to FIG. 13, the electronic apparatus 10-10 may include the side portion 50 including the frame 51 and the cover 53, a touch switch unit TSW-3 disposed in the side portion 50 and including the first and second force members FM1 and FM2 and the first and second touch members TM1 and TM2, and a touch sensing device 100-5 configured to detect a touch through the touch switch unit TSW.

The touch sensing device may include a first hybrid sensing unit HB-S100, a second hybrid sensing unit HB-S200, and a circuit unit 900.

The first hybrid sensing unit HB-S100 may include the first sensing electrode SE1 and the first sensing inductor LE1, disposed inside the cover 53 and electrically connected to each other, and the first sensing coil SC1 disposed to be spaced apart from the internal side surface of the frame 51 by a predetermined distance (for example, D1). Accordingly, when a touch (for example, a contact+a pressing touch) of the human body 1 is applied through the cover 53, capacitance varies depending on parasitic capacitance formed between the first sensing electrode SE1 and the human body 1 according to the touch (for example, the contact and the pressing touch), and inductance may vary depending on a change in a distance between the first sensing coil SC1 and the frames 51.

The second hybrid sensing unit HB-S200 may include the second sensing electrode SE2 and the second sensing inductor LE2, disposed inside the cover 53 and electrically connected to each other, and the second sensing coil SC2 disposed to be spaced apart from the internal side surface of the frame 51 by a predetermined distance (for example, D2). Accordingly, when a touch (for example, a contact and a pressing touch) of the human body 1 is applied through the cover 53, capacitance varies depending on parasitic capacitance formed between the second sensing electrode SE2 and the human body 1 according to the touch (for example, the contact and the pressing touch), and inductance may vary depending on a change in a distance between the second sensing coil SC2 and the frame 51.

The circuit unit 900 may detect whether each touch of the human body 1 is input, based on the variations in the capacitance and the variations in the inductance with the first and second hybrid sensing units HB-S100 and HB-S200.

For example, the first hybrid sensing unit HB-S100 may include the first sensing electrode SE1 and the first sensing inductor LE1 disposed inside the first touch member TM1, the first connection wire W10, the first sensing coil SC1 disposed to be spaced apart from an internal side surface of the first force member FM1 by a predetermined distance, and the first support member 300-10.

The first sensing electrode SE1 may be disposed inside the first touch member TM1, which is a portion of the cover 53.

The first sensing inductor LE1 may be electrically connected to the first sensing electrode SE1 and mounted on the substrate 200-1.

The first connection wire W10 may electrically connect the first sensing electrode SE1 and one end of the first sensing inductor LE1 to each other.

The first sensing coil SC1 may be spaced apart from an internal side surface of the first force member FM1, which is a portion of the frame 51, by a predetermined distance and may be mounted on the substrate 200-1 to oppose the internal side surface of the first force member FM1.

As an example, the first support member 300-10 may include the first body member 300-1 and the first column members 300-11 and 300-12.

The first body member 300-1 may be supported by the internal structure 51s of the frame 51, and may support a portion of the substrate 200-1 on which the first sensing inductor LE1 and the first sensing coil SC1 are mounted.

The first column members 300-11 and 300-12 are supported on the first body member 300-1, and may be attached to both ends of the first force member FM1. When a touch (for example, a pressing touch) is not applied through the first force member FM1 due to the first support member 300-10, a predetermined distance (for example, D1) from the first force member FM1 to the first sensing coil SC1 may be maintained. When a touch (for example, a pressing touch) is applied through the first force member FM1, the first force member FM1 may be inwardly deflected.

For example, the second hybrid sensing unit HB-S200 may include the second sensing electrode SE2 disposed inside the second touch member TM2, the second sensing inductor LE2, the second connection wire W20, the second sensing coil SC2 disposed to be spaced apart from the internal surface of the second force member FM2 by a predetermined distance, and the second support member 300-20.

The second sensing electrode SE2 may be disposed inside the second touch member TM2, which is a portion of the cover 53.

The second sensing inductor LE2 may be electrically connected to the second sensing electrode SE2 and may be mounted on the substrate 200-1.

The second connection wire W20 may electrically connect the second sensing electrode SE2 and one end of the second sensing inductor LE2 to each other.

The second sensing coil SC2 is spaced apart from the internal side surface of the second force member FM2, which is a portion of the frame 51, by a predetermined distance and may be mounted on the substrate 200-1 to oppose the internal side surface of the second force member FM2.

As an example, the second support member 300-20 may include the second body member 300-2 and the second column members 300-21 and 300-22.

The second body member 300-2 may be supported by the internal structure 51s of the frame 51, and may support a portion of the substrate 200-1 on which the second sensing inductor LE2 and the second sensing coil SC2 are mounted.

The second column members 300-21 and 300-22 may be supported on the second body member 300-2, and may be attached to both ends of the second force member FM2.

When a touch (for example, a pressing touch) is not applied through the second force member FM2 due to the second support member 300-20, a predetermined distance (for example, D2) from the second force member FM2 to the second sensing coil SC2 may be maintained. When a touch (for example, a pressing touch) is applied through the second force member FM2, the second force member FM2 may be inwardly deflected.

Referring to FIG. 13, as an example, in the side portion 50 of the electronic apparatus 10-10, the first touch member TM1 and the first force member FM1 may be disposed adjacent to each other, and the second touch member TM2 and the second force member FM2 may be disposed adjacent to each other, such that they are simultaneously contacted and pressed when a touch occurs once.

For example, when the human hand touches the side portion 50, the first touch member TM1 and the first force member FM1 may be simultaneously touched or the second touch member TM2 and the second force member FM2 may be simultaneously touched, and, accordingly, dispositions and sizes of the first touch member TM1, the first force member FM1, the second touch member TM2, and the second force member FM2 may be determined to perform a hybrid sensing operation.

Figure 14:
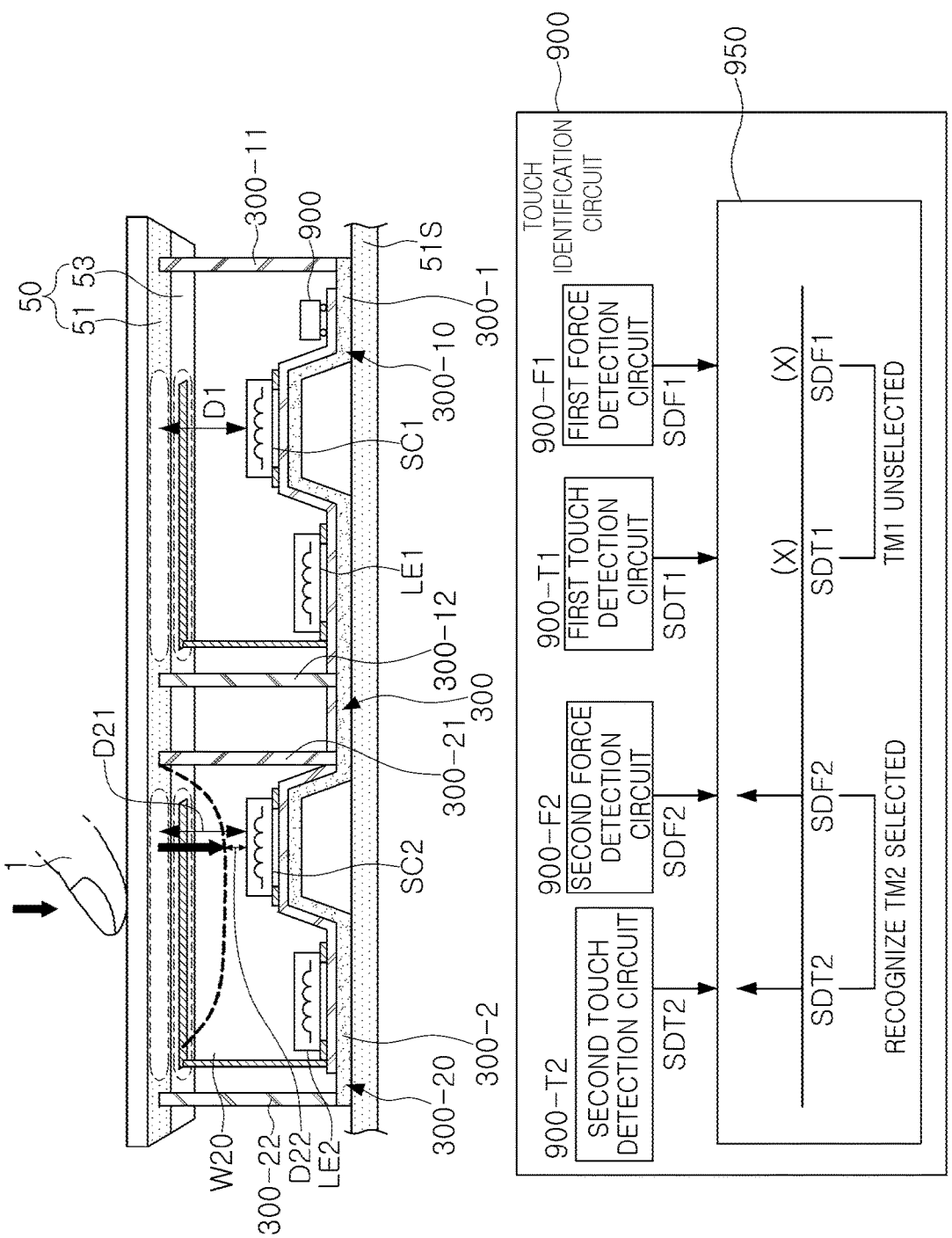
FIG. 14 is a view illustrating an operation of the electronic apparatus of FIG. 13, according to an example.

FIG. 14 is a view illustrating an operation of the electronic apparatus 10-10 in FIG. 13.

Referring to FIGS. 13 and 14, the circuit unit 900 may include a first touch detection circuit 900-T1, a first force detection circuit 900-F1, a second touch detection circuit 900-T2, a second force detection circuit 900-F2, and a touch identification circuit 950.

The first touch detection circuit 900-T1 may output a first touch detection signal for the first touch member TM1, based on capacitance variation depending on parasitic capacitance formed between the human body 1 and the first sensing electrode SE1 when a touch (for example, a contact) of the human body 1 occurs through the first touch member TM1.

The first force detection circuit 900-F1 may output a first force detection signal SDF1 for the first force member FM1, based on inductance variation occurring as the first force member FM1 is inwardly deflected when a touch (for example, a pressing touch) of the human body 1 occurs through the first force member FM1.

The second touch detection circuit 900-T2 may output a second touch detection signal SDT2 for the second touch member, based on capacitance variation depending on parasitic capacitance formed between the human body 1 and the second sensing electrode SE2 when a touch (for example, a contact) of the human body 1 occurs through the second touch member TM2.

The second force detection circuit 900-F2 may output a second force detection signal SDF2 for the second force member FM2, based on inductance variation occurring as the second force member FM2 is inwardly deflected when a touch (for example, a pressing touch) of the human body 1 occurs through the second force member FM2.

The touch identification circuit 950 may identify a touch switch, based on the first touch detection signal SDT1, the first force detection signal SDF1, the second touch detection signal SDT2, and the second force detection signal SDF2.

For example, each of the first touch detection circuit 900-T1, the first force detection circuit 900-F1, the second touch detection circuit 900-T2, and the second force detection circuit 900-F2 may output a detection signal higher than a threshold value when a touch for a corresponding touch member or a corresponding force member occurs.

As an example, as illustrated in FIG. 14, when the second touch member TM2 and the second force member FM2 are touched, the second touch detection circuit 900-T2 and the second force detection circuit 900-F2 may output the second touch and second force detection signals SDT2 and SDF2.

The touch identification circuit 950 may receive the second touch and second force detection signals SDT2 and SDF2. When the second touch and second force detection signals SDT2 and SDF2 have a value higher than a threshold value, the touch identification circuit 950 may recognize that the second touch member TM2 and the second force member FM2 were touched.

In contrast, as an example, when the human body 1 (for example, a human hand) touches (contacts and presses) the first force member FM1 and the first touch member TM1, the touch identification circuit 950 may recognize that the first touch member TM1 and the first force member FM1 are touched, based on the first force detection signal SDF1 and the first touch detection signal SDT1, through the above-described operations.

Figure 15:
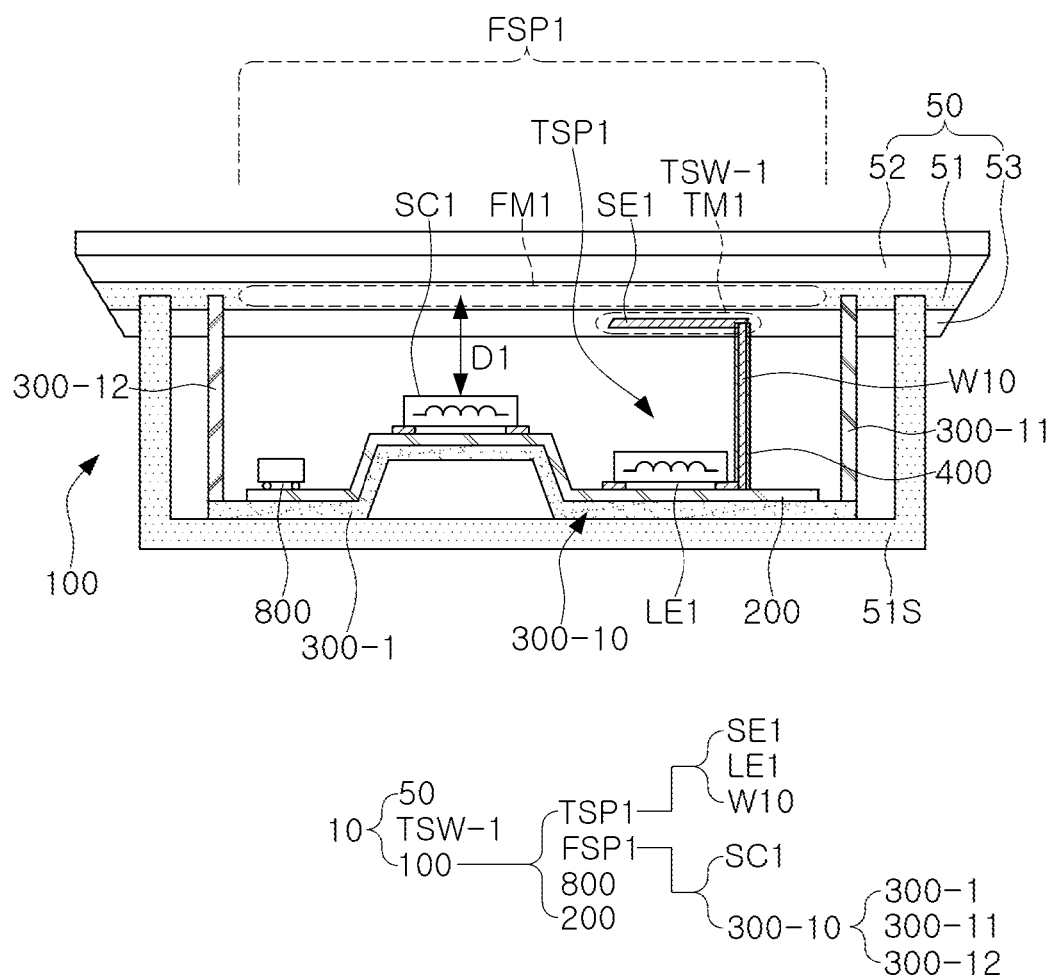
FIG. 15 is a view illustrating an internal structure of an electronic apparatus, according to an example.

FIG. 15 is a view illustrating an internal structure of an electronic apparatus 10-11, according to an example.

The electronic apparatus 10-11, illustrated in FIG. 15, may further include a shielding member 400, as compared with the electronic apparatus in FIG. 6.

The shielding member 400 may be disposed to surround at least a portion (for example, an entirety) of the first connection wire W10 to prevent a contact of the first connection wire W10 with other adjacent elements such as the internal structure 51s of the frame 51, the substrate 200, the first sensing inductor LE1, and the like. Accordingly, the shielding member 400 may electrically shield the first connection wire W10 from other elements.

For example, the shielding member 400 may be a cable covering material formed of a conductive material capable of performing electrical shielding, but the shielding member 400 is not limited to such examples.

Since the first connection wire W10 may be electrically shielded from other elements by the shielding member 400, the first sensing inductor LE1 and the substrate 200 may be more freely disposed. Thus, the degree of freedom in disposing components of the electronic apparatus 10-11 may be improved.

The electronic device 10-11 is described as a modified example of the electronic device 10-5 of FIG. 6, however, the shielding member 400 may be applied to all connection wires connecting each sensing electrode and a corresponding sensing inductor in other embodiments.

Figure 16:
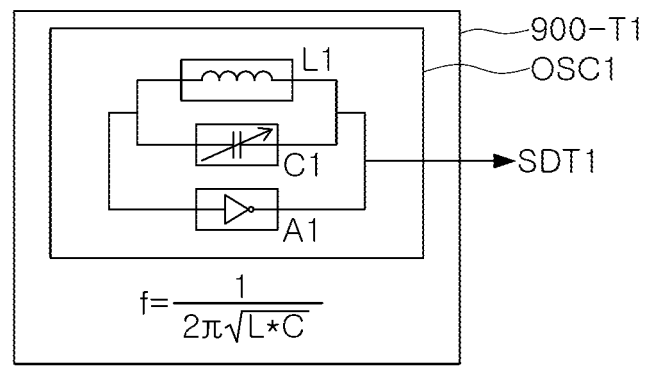
FIG. 16 is a view illustrating an example of a first touch detection circuit.

FIG. 16 is a view illustrating an example of the first touch detection circuit 900-T1.

Referring to FIG. 16, the first touch detection circuit 900-T1 may include a first oscillation circuit OSC1, and the first oscillation circuit OSC1 may include an inductance unit L1, a capacitance unit C1, and an amplifier unit A1.

The inductance unit L1 may have inductance L, and the capacitance unit C1 may have capacitance C. The inductance unit L1 and the capacitance unit C1 constitutes a resonance circuit, so that resonance occurs at a frequency f determined by the inductance L and the capacitance C. The amplifier unit A1 may form negative resistance such that the resonance circuit maintains resonance to oscillate, and thus, a first touch detection signal SDT1 having a corresponding resonant frequency may be generated.

In this case, since overall capacitance varies depending on parasitic capacitance formed by a touch, a resonant frequency may vary. A count value, generated by counting the resonant frequency, may be used to detect whether a touch occurs.

Such an operation principle may be applied to the second touch detection circuit 900-T2.

Figure 17:
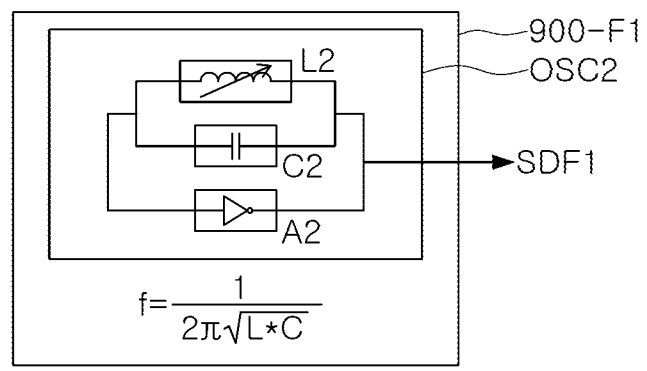
FIG. 17 is a view illustrating an example of a first force detection circuit.

FIG. 17 is a view illustrating an example of the first force detection circuit 900-F1.

Referring to FIG. 17, the first force detection circuit 900-F1 may include a second oscillation circuit OSC2, and the second oscillation circuit OSC2 may include an inductance unit L2, a capacitance unit C2, and an amplifier unit A2.

The inductance unit L2 may have inductance L, and the capacitance unit C2 may have capacitance (C). The inductance unit L2 and the capacitance unit C2 constitutes a resonance circuit, so that resonance occurs at a frequency f determined by the inductance L and the capacitance C. The amplifier unit A2 may form negative resistance such that the resonance circuit maintains resonance to oscillate, and thus, a second touch detection signal SDT2 having a resonant frequency may be generated.

In this case, the resonant frequency may vary depending on a change in capacitance formed by a force. A count value, generated by counting the resonant frequency, may be used to detect whether force is applied.

Such an operation principle may be applied to the second force detection circuit 900-F2.

Figure 18:
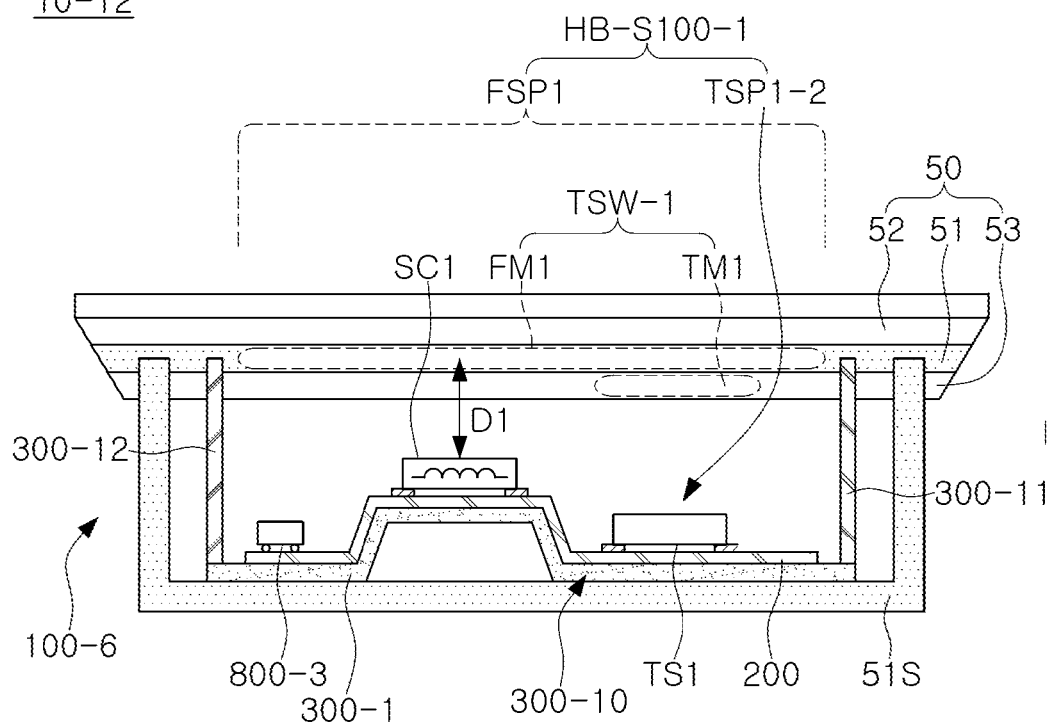
FIG. 18 is a view illustrating an internal structure of an electronic apparatus, according to an example.
Figure 18:
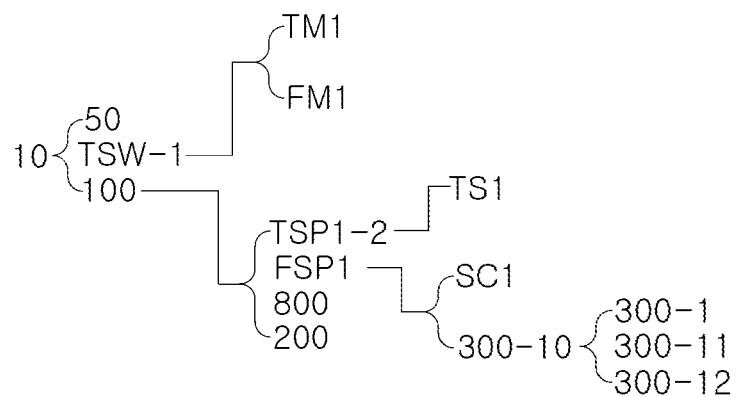

FIG. 18 is a view illustrating an internal structure of an electronic apparatus 10-12, according to an example. A difference between the electronic apparatus 10-12 and the electronic apparatus 10-5 illustrated in FIG. 6 lies in a first touch sensing unit TSP1-2, and a description thereof will be provided while focusing on the differences with respect to the electronic apparatus 10-5 and omitting a description of the same contents.

Referring to FIG. 18, the electronic apparatus 10-12 includes the side portion 50, the touch switch unit TSW-1, the first touch sensing unit TSP1-2, the first force sensing unit FSP1, and a circuit unit 800-3. The first touch sensing unit TSP1-2 and the first force sensing unit FSP1 constitute a first hybrid sensor unit HB-S100-1.

The side portion 50 may have the cover 53 and the frame 51 coupled to the cover 53.

The touch switch unit TSW-1 may include the first touch member TM1, which is a portion of the cover 53, and the first force member FM1, which is a portion of the frame 51.

The first touch sensing unit TSP1-2 may be disposed inside the cover 53. When a touch of an object occurs on the cover 53, the first touch sensing unit TSP1-2 may output a first sensing signal SS1 depending on whether the touch occurs.

The first force sensing unit FSP1 includes the first sensing coil SC1 disposed to be spaced apart from the internal side surface of the frame 51 by a predetermined distance. When a pressing touch is applied through the frame 51, the first force sensing unit FSP1 may provide a second sensing signal SS2 having a variable magnitude depending on whether the pressing touch is applied.

The circuit unit 800-3 may detect whether a touch is input by the human body 1, based on the first sensing signal SS1 generated by the first touch sensing unit TSP1-2 and the second sensing signal SS2 generated by the first force sensing unit FSP1.

The first force sensing unit FSP1 may include the first sensing coil SC1 and the first support member 300-10 including the first body member 300-1 and the first column members 300-11 and 300-12.

The first sensing coil SC1 may be spaced apart from the first force member FM1 by a predetermined distance and may be mounted on the substrate 200 to oppose the internal side surface of the first force member FM1.

The first body member 300-1 and the first column members 300-11 and 300-12 may be supported by the internal structure 51S of the frame 51. When a pressing touch is not applied through the first force member FM1, the first body member 300-1 and the first column members 300-11 and 300-12 may support the first force member FM1 such that a predetermined distance to the force member FM1 and a predetermined distance to the first sensing coil SC1 are maintained. When a pressing touch is applied through the first force member FM1, the first body member 300-1 and the first column members 300-11 and 300-12 may allow the first force member FM to be inwardly deflected.

For example, when a touch sensing device 100-6 includes the first hybrid sensor unit HB-S100-1, the first touch sensing unit TSP1-2 included in the first hybrid sensor unit HB-S100-1 may include a sensor TS1 that is one of an optical sensor, an ultrasonic sensor, and a temperature sensor, but is not limited to such examples.

For example, with respect to the hybrid sensor unit HB-S100-1, a case in which the sensor TS1 is an optical sensor will be described with reference to FIG. 19. Alternatively, a case in which a first hybrid sensor unit HB-S100-

1' includes first touch sensing unit TSP1-2' including an ultrasonic sensor TS1' will be described with reference to FIG. 20.

Figure 19:
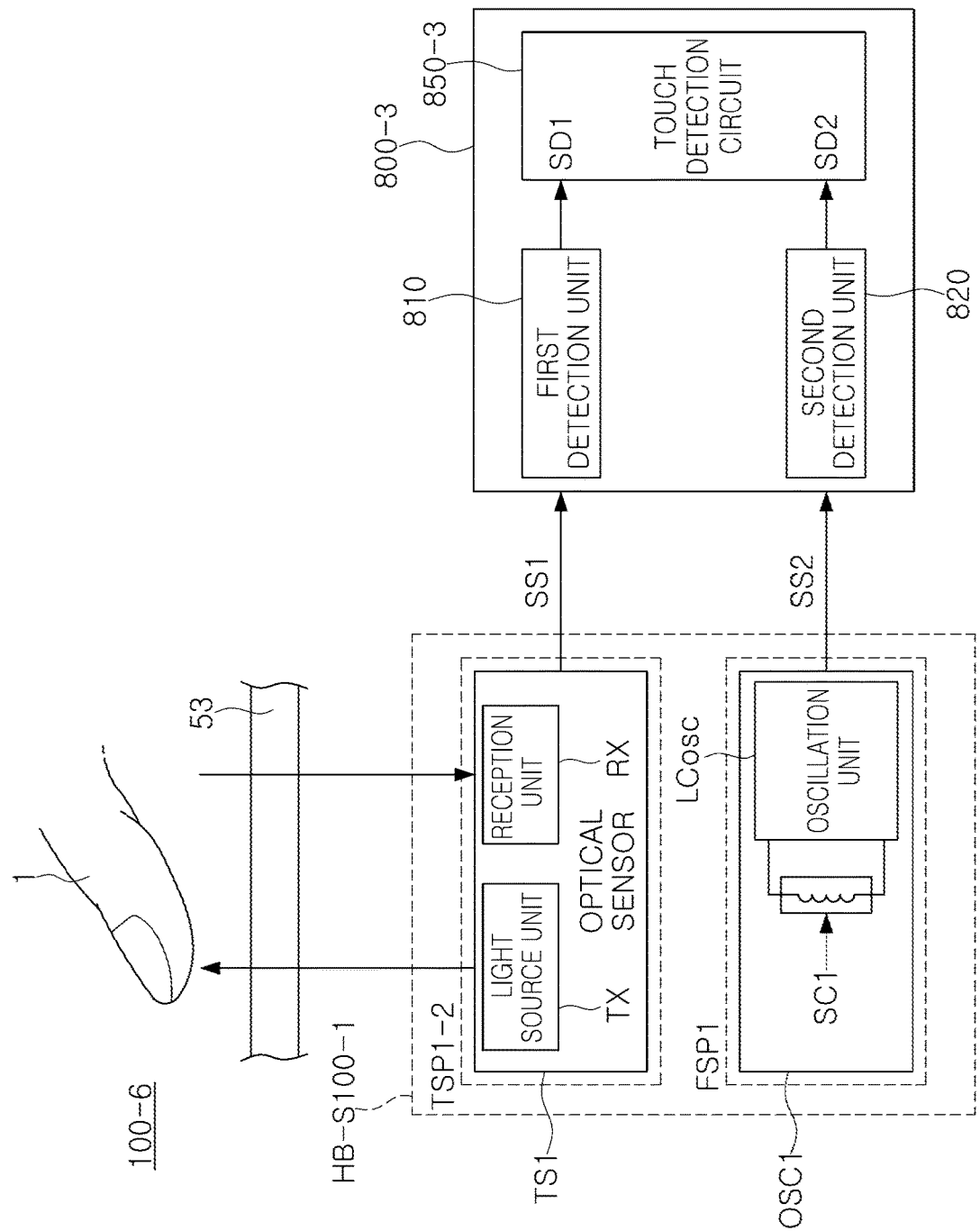
FIG. 19 is a view illustrating an example of a touch sensing device of the electronic apparatus of FIG. 18, according to an example.

FIG. 19 is a view illustrating an example of the touch sensing device 100-6 of the electronic apparatus 10-12 in FIG. 18.

Referring to FIG. 19, the first touch sensing unit TSP1-2 may include the optical sensor TS1. In this case, the first touch sensing unit TSP1-2 may be disposed on an internal side surface of the first touch member TM1. The first touch sensing unit TSP1-2 may detect not only a touch on the first touch member TM1 but also a proximity of the touch, in an untouched state immediately before the touch. Such a continuous operation including the touch and the proximity will be referred to as a proximity touch. As an example, the cover 53 including the first touch member TM1 may be formed of a material through which an optical signal may pass, such as glass or plastic, but the material of the cover 53 is not limited thereto.

The optical sensor TS1 may include a light source unit TX configured to generate and transmit an optical signal to the outside of the cover 53, and a reception unit RX configured to receive a reflected signal incident after the optical signal is reflected by an external object and then passes through the cover 53. The reception unit RX may output a first sensing signal SS1.

The first force sensing unit FSP1 may include the first oscillation circuit OSC1. The first oscillation circuit OSC1 may include a first sensing coil SC1 and an oscillation unit LCosc connected to the first sensing coil SC1, and may output a second sensing signal SS2. As an example, the oscillation unit LCosc included in the first oscillation circuit OSC1 may include a capacitance providing portion (for example, a capacitor element) and a resonance maintaining portion (for example, an inverter element). A portion or an entirety of the oscillation unit LCosc may be included in the circuit unit 800-3, or may be mounted on the substrate 200 outside the circuit unit 800-3.

The circuit unit 800-3 may include a first detection unit 810, a second detection unit 820, and a touch detection circuit 850-3.

The first detection unit 810 may output a first detection signal SD1 when a magnitude of the first sensing signal SS1, input from the first touch sensing unit TSP1-2, is greater than or equal to a first threshold value. The first threshold value may be a reference value preset to determine whether a touch is input, based on the magnitude of the first sensing signal SS1.

The second detection unit 820 may output a second detection signal SD2 when a magnitude of the second sensing signal SS2, input from the first force sensing unit FSP1, is greater than or equal to a second threshold value. The second threshold value may be a reference value preset to determine whether force is applied, based on the magnitude of the second sensing signal SS2.

The touch detection circuit 850 may recognize whether a touch is applied, based on the first detection signal SD1 and the second detection signal SD2. For example, when the human body 1 touches the first touch member TM1, the first detection signal SD1 may be a high-level signal. In addition, when the human body 1 applies a pressing touch to the force member FM1, the second detection signal SD2 may be a high-level signal. Accordingly, when both the first detection signal SD1 and the second detection signal SD2 are high-level signals, a touch of the human body 1 may be recognized.

On the other hand, when an object other than a human body touches the first touch member TM1, the first detection signal SD1 may be a high-level signal. In addition, when the object does not apply a pressing touch to the force member FM1, the second detection signal SD2 may be a low-level signal. Accordingly, when both the first detection signal SD1 and the second detection signal SD2 are not high-level signals, it may be recognized that the touch is not the touch of the human body.

As described above, an intentional touch applied by the human body 1 and an unintentional touch applied by the object other than a human body, may be recognized and distinguished using touch sensing and force sensing.

Figure 20:
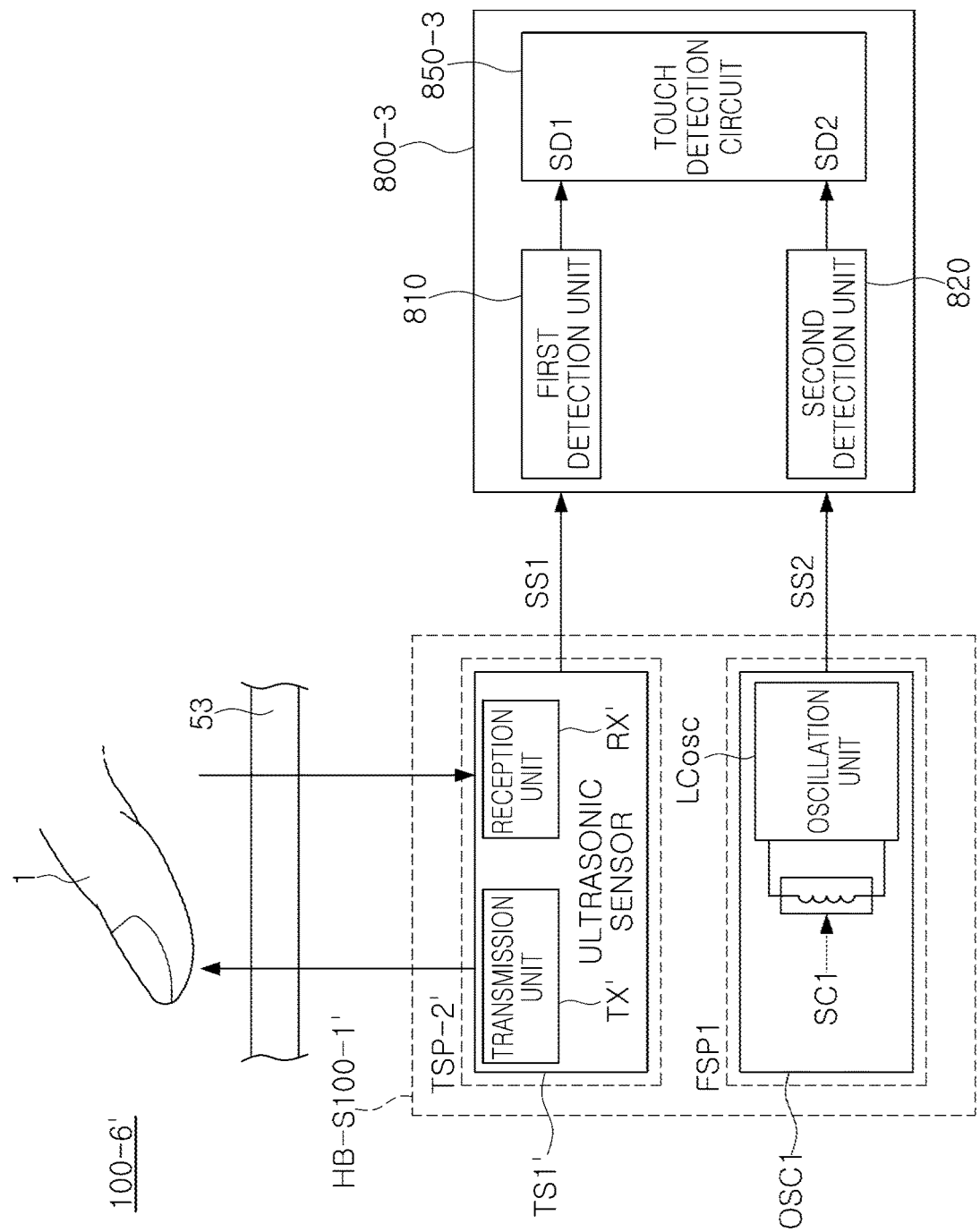
FIG. 20 is a view illustrating an example of a touch sensing device of the electronic apparatus of FIG. 18, according to an example.

FIG. 20 is a view illustrating another example of a touch sensing device 100-6' that may be included in the electronic apparatus 10-12 in FIG. 18 instead of the touch sensing device 100-6 described above.

A difference between a touch sensing device 100-6 illustrated in FIG. 19 and a touch sensing device 100-6' illustrated in FIG. 20 lies in a first touch sensing unit TSP1-20' included in the touch sensing device 100-6'. In the discussion of FIG. 20, the same descriptions as those given with reference to FIG. 19 will be omitted. Referring to FIG. 20, the first touch sensing unit TSP1-2' may include an ultrasonic sensor TS1'. In this case, the first touch sensing unit TSP1-2' may be disposed on an internal side surface of the first touch member TM1. As an example, the cover 53 including the first touch member TM1 may be formed of a material through which an ultrasonic signal may pass, such as glass or plastic, but the material of the cover 53 is not limited thereto.

The ultrasonic sensor TS1' may include a transmission unit TX' configured to generate and transmit an ultrasonic signal to the outside of the cover 53, and reception unit RX' configured to receive a reflected signal incident after the ultrasonic signal is reflected by an external object and then passes through the cover 53. The reception unit RX' may output a first sensing signal SS1.

In addition, the first force sensing unit FSP1 may include the first oscillation circuit OSC1. The first oscillation circuit OSC1 may include a first sensing coil SC1 and an oscillation unit LCosc connected to the first sensing coil SC1, and may output a second sensing signal SS2. As an example, the oscillation unit LCosc included in the first oscillation circuit OSC1 may include a capacitance providing portion (for example, a capacitor element) and a resonance maintaining portion (for example, an inverter element). A portion or entirety of the oscillation unit LCosc may be included in the oscillator a circuit unit 800, or may be mounted on the substrate 200 outside the circuit unit 800-3.

The circuit unit 800-3 may include the first detection unit 810, the second detection unit 820, and the touch detection circuit 850.

The first detection unit 810 may output a first detection signal SD1 when the magnitude of the first sensing signal SS1, input from the first touch sensing unit TSP1-2', is greater than or equal to a first threshold value.

The second detection unit 820 may output a second detection signal SD2 when the magnitude of the second sensing signal SS2, input from the first force sensing unit FSP1, is greater than or equal to a second threshold value.

The touch detection circuit 850 may recognize whether a touch is input, based on the first detection signal SD1 and the second detection signal SD2. For example, when the human body 1 touches a first touch member TM1', the first detection signal SD1 may be a high-level signal. In addition, when the human body 1 applies a pressing touch to a first force member FM1, the second detection signal SD2 may be a high-level signal. Accordingly, when both the first detection signal SD1 and the second detection signal SD2 are high-level signals, a touch of the human body 1 may be recognized.

Hereinafter, a description will be given of a case in which an object other than a human body touches a side surface 50 of an electronic apparatus 10-12. In this case, when an object other than a human body touches the first touch member TM1, the first detection signal SD1 may be a high-level signal. On the other hand, when the object does apply a pressing touch to the first force member FM1, the second detection signal SD2 may be a low-level signal. Accordingly, when both the first detection signal SD1 and the second detection signal SD2 are not high-level signals, it may be recognized that the touch is not a touch of a human body.

As described above, an intentional touch applied by the human body and an unintentional touch applied by the object other than the human body, may be recognized and distinguished using touch sensing and force sensing.

In the description herein, an electronic apparatus may include a sensor having another sensing structure, rather than a capacitance sensing structure including a sensing electrode and a sensing inductor disposed inside a cover. For example, as described above, the sensor having another sensing structure may be an optical sensor, an ultrasonic sensor, a temperature sensor, or the like. An employed sensor among the optical sensor, the ultrasonic sensor, and the temperature sensor may be disposed on an internal side surface of a touch member, which is a portion of a cover. As an example, the temperature sensor may detect a temperature variation using a touch of a human body.

Since the above-mentioned optical sensor, ultrasonic sensor, and temperature sensor are only examples of touch sensors, any sensor may be employed in the touch sensor unit disclosed herein, as long as the sensor may detect a touch.

In addition, any sensor may replace the first force sensing unit FSP1 as long as the sensor may detect force. As an example, a strain gage or a piezoelectric sensor may replace the first force sensing unit FSP1.

Accordingly, as described above, any sensor may be applied to each of the touch sensing unit (for example, TSP1) and the force sensing unit (for example, FSP1) included in the structure of a unit hybrid sensor (for example, HB-S100) as long as the sensor may sense a touch. In addition, any sensor may be applied to the force sensing unit (for example, FSP1) as long as the sensor may sense force.

As described above, the disclosure herein may be applied to be available in a switch (for example, a mobile side switch) of a mobile or wearable device.

The examples described above may replace a volume key or a power key disposed on the side of an existing mobile phone, and each example described herein may be used in a device having a rear cover structure (for example, a cover structure made of a nonconductive material). In addition, a sensing method of a structure according to each embodiment disclosed herein is different from a sensing method used in a touchscreen of a front display glass.

In a certain existing structures, a coil is attached to a surface disposed directly below the coil. However, in this disclosure, a coil is not attached to glass. In an existing case, a coil of 16 mm or more is required. However, according to this disclosure, an operation may be performed even with a relatively shorter sensing coil (inductance) by improving sensing efficiency. For example, lower inductance may be sensed.

In an existing capacitance sensing method, a touch is recognized using variable capacitance formed by performing LC resonance using an LDC IC through a touch-on-metal (ToM) technology and deflecting a metal, which is a touch target surface. However, this disclosure adopts a capacitance sensing method of detecting a change in parasitic capacitance formed between a human hand and a sensing electrode of a conductor present inside of glass when the human hand touches the glass, rather than a method using an eddy current change caused by a change in distance between a coil and a metal occurring when a metal is deflected.

As described above, according to an example, the degree of freedom in internal disposition of a sensing inductor may be improved.

In addition, a sensing electrode may be disposed inside a cover (for example, back glass), which is formed of a nonconductive material, to improve identification of each touch switch in multi-touch operations.

In addition, capacitance sensing and inductance sensing may be simultaneously performed when a touch (for example, a contact) of a human body occurs, and the capacitance sensing may not be performed when a touch (for example, a contact) of a non-human body occurs. Thus, touch sensing identification may be improved.

As a result, an issue of malfunction caused by distortion of an electronic apparatus to which a sensing device is applied, may be addressed through hybrid sensing in which both capacitance sensing and inductance sensing are performed.

The light source unit TX, the transmission unit TX', the oscillation unit LCosc, the reception units RX and RX', the first detection unit 810, the second detection unit 820, and other units and modules in FIGS. 1-20 that perform the operations described in this application are implemented by hardware components configured to perform the operations described in this application that are performed by the hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 1-20 that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions in the specification, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While specific examples have been shown and described above, it will be apparent after an understanding of this disclosure that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A touch sensing device applied to an electronic apparatus including a side portion having a cover and a frame, and a touch switch unit including a first touch member and a first force member, the touch sensing device comprising:
a first touch sensing unit disposed inside the cover and including a first sensing electrode and a first sensing inductor electrically connected to each other by a first connection wire electrically connecting the first sensing electrode and one end of the first sensing inductor, wherein capacitance of the first touch sensing unit varies depending on parasitic capacitance formed between the first sensing electrode and a human body according to a contact of the human body applied through the first touch member;
a first force sensing unit including a first sensing coil disposed to be spaced apart from an internal side surface of the frame, wherein inductance of the first force sensing unit varies depending on a change in distance between the first sensing coil and the frame according to a pressing touch applied through the first force member; and
a circuit unit configured to detect whether a touch of the human body is input, based on variations in the capacitance of the first touch sensing unit and variations in the inductance of the first force sensing unit.

2. The touch sensing device of claim 1, wherein the first sensing electrode is disposed inside the first touch member the first touch member being a portion of the cover, and
wherein the first sensing inductor is mounted on a substrate.

3. The touch sensing device of claim 2, wherein the first sensing electrode includes two first sensing electrodes disposed in different locations of an internal side of a first touch member that is a portion of a cover, and connected to the one end and another end of the first sensing inductor, and
wherein the first connection wire includes two first connection wires respectively electrically connecting the two first sensing electrodes to the one end and the other end of the first sensing inductor.

4. The touch sensing device of claim 1, wherein the first sensing coil is disposed to be spaced apart from the first force member and is mounted on a substrate to oppose an internal side surface of the first force member,
wherein the first force member is a portion of the frame, and
wherein the first force sensing unit further includes a first support member including a first body member supported by an internal structure of the frame and configured to support a portion of the substrate on which the first sensing coil is mounted, and first column members supported on the first body member and attached to ends of the first force member.

5. The touch sensing device of claim 1, further comprising:
a second touch sensing unit disposed inside the cover and including a second sensing electrode and a second sensing inductor electrically connected to each other, wherein capacitance of the second touch sensing unit varies depending on parasitic capacitance formed between the second sensing electrode and the human body according to a contact of the human body applied through a second touch member of the cover.

6. The touch sensing device of claim 5, wherein the second sensing electrode is disposed inside a second touch member that is a portion of the cover,
wherein the second sensing inductor is mounted on a substrate, and
wherein the second touch sensing unit further includes a second connection wire electrically connecting the second sensing electrode and one end of the second sensing inductor to each other.

7. The touch sensing device of claim 6, wherein the second sensing electrode includes two second sensing electrodes disposed in different locations of an internal side of a second touch member that is a portion of the cover, and connected to one end and another end of the second sensing inductor, and
wherein the second connection wire includes two second connection wires respectively electrically connecting the two second sensing electrodes to the one end and the other end of the second sensing inductor.

8. The touch sensing device of claim 6, wherein the circuit unit comprises:
a first touch detection circuit configured to output, in response to the contact of the human body applied through the first touch member occurring, a first touch detection signal for the first touch member based on capacitance variation depending on the parasitic capacitance formed between the first sensing electrode and the human body;
a first force detection circuit configured to output, in response to the pressing touch applied through the first force member occurring, a first force detection signal for the first force member based on inductance variation occurring as the first force member is inwardly deflected;
a second touch detection circuit configured to output, in response to the contact of the human body applied through the second touch member occurring, a second touch detection signal for the second touch member based on capacitance variation depending on the parasitic capacitance formed between the second sensing electrode and the human body; and
a touch identification circuit configured to identify a touch switch based on the first touch detection signal, the first force detection signal, and the second touch detection signal.

9. The touch sensing device of claim 6, wherein the first touch member, the first force member, and the second touch member are disposed in a zigzag form.

10. The touch sensing device of claim 6, wherein a boundary of the frame and the cover has a zigzag form, and
wherein the first touch member, the first force member, and the second touch member are disposed on a straight line.

11. The touch sensing device of claim 1, further comprising:
a second force sensing unit including a second sensing coil disposed to be spaced apart from the internal side surface of the frame, wherein inductance of the second force sensing unit varies depending on a change in distance between the second sensing coil and the frame according to a pressing touch (applied through a second force member that is a portion of the frame.

12. The touch sensing device of claim 11, wherein the second sensing coil is disposed to be spaced apart from an internal side surface of the second force member, and
wherein the second force sensing unit further includes a second support member including:
a second body member supported by an internal structure of the frame, and configured to support a portion of the substrate on which the second sensing coil is mounted; and
second column members supported on the second body member and attached to ends of the second force member.

13. The touch sensing device of claim 11, wherein the first sensing electrode is disposed on an entire internal side of the cover opposing the first and second sensing coils and the first sensing inductor.

14. The touch sensing device of claim 11, wherein the circuit unit comprises:
a first force detection circuit configured to output, in response to the pressing touch applied through the first force member occurring, a first force detection signal for the first force member based on inductance variation occurring as the first force member is inwardly deflected;
a first touch detection circuit configured to output, in response to the contact of the human body applied through the first touch member occurring, a first touch detection signal for the first touch member based on capacitance variation depending on the parasitic capacitance formed between the first sensing electrode and the human body;
a second force detection circuit configured to output, in response to the pressing touch applied through the second force member occurring, a second force detection signal for the second force member based on inductance variation occurring as the second force member is inwardly deflected; and a touch identification circuit configured to identify a location of the touch of the human body based on the first force detection signal, the first touch detection signal, and the second force detection signal.

15. The electronic device of claim 1, wherein the circuit unit comprises:

a detection circuit configured to output a first detection signal based on a variation in the capacitance, and output a second detection signal based on a variation in the inductance; and a touch identification circuit configured to recognize the touch input by the human body, in response to the first detection signal being higher than a first threshold value and the second detection signal being higher than a second threshold value.

16. The electronic device of claim 1, wherein the circuit unit comprises:

a detection circuit configured to output detection signals based on variations in the capacitance and the inductance; and a touch identification circuit configured to recognize the touch input by the human body, based on comparisons of the detection signals to threshold values.

17. An electronic apparatus, comprising:

a side portion including a cover and a frame coupled to the cover;

a touch switch unit including a first touch member that is a portion of the cover, and a force member that is a portion of the frame;

a first touch sensing unit disposed inside the cover and including a first sensing electrode and a first sensing inductor electrically connected to each other by a first connection wire electrically connecting the first sensing electrode and one end of the first sensing inductor, wherein capacitance of the first touch sensing unit varies depending on parasitic capacitance formed between the first sensing electrode and a human body according to a contact of the human body applied through the first touch member;

a first force sensing unit including a first sensing coil disposed to be spaced apart from an internal side surface of the frame, wherein inductance of the first force sensing unit varies depending on a change in distance between the first sensing coil and the frame according to a pressing touch applied through the first force member; and a circuit unit configured to detect whether a touch of the human body is input, based on variations in the capacitance of the first touch sensing unit and variations in the inductance of the force sensing unit.

18. The electronic apparatus of claim 17, wherein the first sensing electrode is disposed inside the first touch member, and wherein the first sensing inductor is mounted on a substrate.

19. The electronic apparatus of claim 18, wherein the first sensing electrode includes two first sensing electrodes disposed in different locations of an internal side of the first touch member, and connected to the one end and another end of the first sensing inductor, and wherein the first connection wire includes two first connection wires respectively electrically connecting the two first sensing electrodes to the one end and the other end of the first sensing inductor.

20. The electronic apparatus of claim 17, wherein the first sensing coil is disposed to be spaced apart from the first force member and is mounted on a substrate to oppose an internal side surface of the first force member, and wherein the first force sensing unit further includes a first support member including a first body member supported by an internal structure of the frame and configured to support a portion of the substrate on which the first sensing coil is mounted, and first column members supported on the first body member and attached to ends of the first force member.

21. The electronic apparatus of claim 17, further comprising:

a second touch sensing unit disposed inside the cover and including a second sensing electrode and a second sensing inductor electrically connected to each other, wherein capacitance of the second touch sensing unit varies depending on parasitic capacitance formed between the second sensing electrode and the human body according to a contact of the human body applied through a second touch member of the cover.

22. The electronic apparatus of claim 21, wherein the second sensing electrode is disposed inside a second touch member;

wherein the second sensing inductor is mounted on a substrate; and wherein the second touch sensing unit further includes a second connection wire electrically connecting the second sensing electrode and one end of the second sensing inductor to each other.

23. The electronic apparatus of claim 22, wherein the second sensing electrode includes two second sensing electrodes disposed in different locations of an internal side of the second touch member, and connected to the one end and another end of the second sensing inductor, and wherein the second connection wire includes two second connection wires respectively electrically connecting the two second sensing electrodes to the one end and the other end of the second sensing inductor.

24. The electronic apparatus of claim 22, wherein the circuit unit comprises:

a first touch detection circuit configured to output, in response to the contact of the human body applied through the first touch member occurring, a first touch detection signal for the first touch member based on capacitance variation depending on the parasitic capacitance formed between the first sensing electrode and the human body;

a first force detection circuit configured to output, in response to the pressing touch applied through the first force member occurring, a first force detection signal for the first force member based on inductance variation occurring as the first force member is inwardly deflected;

a second touch detection circuit configured to output, in response to the contact of the human body applied through the second touch member occurring, a second touch detection signal for the second touch member based on capacitance variation depending on the parasitic capacitance formed between the second sensing electrode and the human body; and a touch identification circuit configured to identify a touch switch based on the first touch detection signal, the first force detection signal, and the second touch detection signal.

25. The electronic apparatus of claim 22, wherein the first touch member, the first force member, and the second touch member are disposed in a zigzag form.

26. The electronic apparatus of claim 22, wherein a boundary of the frame and the cover has a zigzag form, and wherein the first touch member, the first force member, and the second touch member are disposed on a straight line.

27. The electronic apparatus of claim 17, further comprising:
a second force sensing unit including a second sensing coil disposed to be spaced apart from an internal side surface of the frame, wherein inductance of the second force sensing unit varies depending on a change in distance between the second sensing coil and the frame according to a pressing touch applied through a second force member that is a portion of the frame.

28. The electronic apparatus of claim 27 wherein the second sensing coil is disposed to be spaced apart from an internal side surface of the second force member, and
wherein the second force sensing unit further includes a second support member including:
a second body member supported by an internal structure of the frame and configured to support a substrate on which the second sensing coil is mounted; and
second column members supported on the second body member and attached to ends of the second force member.

29. The electronic apparatus of claim 27, wherein the first sensing electrode is disposed on an entire internal side of the cover opposing the first and second sensing coils and the first sensing inductor.

30. The electronic apparatus of claim 27, wherein the circuit unit comprises:
a first force detection circuit configured to output, in response to the pressing touch applied through the first force member occurring, a first force detection signal for the first force member based on inductance variation occurring as the first force member is inwardly deflected;
a first touch detection circuit configured to output, in response to the contact of the human body applied through the first touch member occurring, a first touch detection signal for the first touch member based on capacitance variation depending on the parasitic capacitance formed between the first sensing electrode and the human body;
a second force detection circuit configured to output, in response to the pressing touch applied through the second force member occurring, a second force detection signal for the second force member based on inductance variation occurring as the second force member is inwardly deflected; and
a touch identification circuit configured to identify a location of the touch of the human body based on the first force detection signal, the first touch detection signal, and the second force detection signal.

31. A touch sensing device applied to an electronic apparatus in which a cover, formed of a first nonconductive material, and a frame, formed of second a conductive material the same as or different than the first nonconductive material, are coupled to each other, the touch sensing device comprising:
a touch sensing unit disposed inside the cover and including a sensing electrode and a sensing inductor electrically connected to each other by a connection wire, and configured to output a first sensing signal, depending on whether a contact is applied to the cover;
a force sensing unit including a sensing coil disposed to be spaced apart from an internal side surface of the frame, the force sensing unit being configured to output a second sensing signal having a variable magnitude, depending on whether a pressing touch is applied through the frame; and
a circuit unit configured to detect whether a touch is input by a human body, based on the first sensing signal and the second sensing signal,
wherein the circuit unit comprises:
a first detection unit configured to output a first detection signal in response to a magnitude of the first sensing signal being greater than or equal to a first threshold value related to touch;
a second detection unit configured to output a second detection signal in response to a magnitude of the second sensing signal being greater than or equal to a second threshold value related to force and different from the first threshold value; and
a touch detection circuit configured to determine whether the touch is input by the human body, based on the first detection signal and the second detection signal.

32. The touch sensing unit of claim 31, wherein the touch sensing unit includes a light source unit configured to generate and transmit an optical signal to an outside of the cover, and a reception unit configured to receive a reflected signal incident after the optical signal is reflected by an external object and then passes through the cover.

33. The touch sensing device of claim 31, wherein the touch sensing unit includes a transmission unit configured to generate and transmit an ultrasonic signal to an outside of the cover, and a reception unit configured to receive a reflected signal incident after the ultrasonic signal is reflected by an external object and then passes through the cover.

34. The touch sensing device of claim 31, wherein the sensing coil is spaced apart from a force member that is a portion of the frame and is mounted on a substrate to oppose an internal side surface of the force member; and
wherein the force sensing unit further includes a support member supported by an internal structure of the frame, the support member being configured to support the force member such that a predetermined distance from the force member to the sensing coil is maintained when the pressing touch is not applied through the force member, and to allow the force member to be inwardly deflected when the pressing touch is applied through the force member.

35. The touch sensing device of claim 31, wherein the touch sensing unit includes any one or any combination of any two or more of an optical sensor, an ultrasonic sensor, and a temperature sensor.

36. An electronic apparatus, comprising:
a side portion including a cover and a frame coupled to the cover;
a touch switch unit including a touch member that is a portion of the cover, and a force member that is a portion of the frame;
a touch sensing unit disposed inside the cover and including a sensing electrode and a sensing inductor electrically connected to each other by a connection wire, and configured to output a first sensing signal, depending on whether a contact is applied to the cover; and
a force sensing unit including a sensing coil disposed to be spaced apart from an internal side surface of the frame, the force sensing unit being configured to output a second sensing signal having a variable magnitude, depending on whether a pressing touch is applied through the frame; and a circuit unit configured to detect whether a touch is input by the human body, based on the sensing signal and the second sensing signal, wherein the circuit unit comprises:

a first detection unit configured to output a first detection signal in response to a magnitude of the first sensing signal being greater than or equal to a first threshold value related to touch;

a second detection unit configured to output a second detection signal in response to a magnitude of the second sensing signal being greater than or equal to a second threshold value related to force and different from the first threshold value; and a touch detection circuit configured to determine whether the touch is input by the human body, based on the first detection signal and the second detection signal.

37. The electronic apparatus of claim 36, wherein the touch sensing unit includes a light source unit configured to generate and transmit an optical signal to an outside of the cover, and a reception unit configured to receive a reflected signal incident after the optical signal is reflected by an external object and then passes through the cover.

38. The electronic apparatus of claim 36, wherein the touch sensing unit includes a transmission unit configured to generate and transmit an ultrasonic signal to an outside of the cover, and a reception unit configured to receive a reflected signal incident after the ultrasonic signal is reflected by an external object and then passes through the cover.

39. The electronic apparatus of claim 36, wherein the sensing coil is spaced apart from the force member and is mounted on a substrate to oppose an internal side surface of the force member; and wherein the force sensing unit further includes a support member supported by an internal structure of the frame, the support member being configured to support the force member such that a predetermined distance from the force member to the sensing coil is maintained when the pressing touch is not applied through the force member, and to allow the force member to be inwardly deflected when the pressing touch is applied through the force member.

40. The electronic apparatus of claim 36, wherein the circuit unit comprises:

a first detection unit configured to output a first detection signal in response to a magnitude of the first sensing signal being greater than or equal to a first threshold value;

a second detection unit configured to output a second detection signal in response to a magnitude of the second sensing signal being greater than or equal to a second threshold value; and a touch detection circuit configured to determine whether the touch is input by the human body, based on the first detection signal and the second detection signal.

41. The touch sensing device of claim 36, wherein the touch sensing unit includes any one or any combination of any two or more of an optical sensor, an ultrasonic sensor, and a temperature sensor.

42. An electronic apparatus, comprising:

a cover including a touch member;

a frame coupled to the cover and including a force member;

a touch sensing unit comprising a sensing electrode and an inductor electrically connected to each other by a first connection wire electrically connecting the sensing electrode and one end of the inductor and disposed inside the cover, and having a capacitance that varies in response to contact of the touch member by a human body; and a force sensing unit including a sensing coil disposed to be spaced apart from an internal side surface of the frame, the force sensing unit having an inductance that varies in response to deflection of the frame caused by a force applied to force member; and a circuit unit configured to recognize a touch input by the human body, based on the capacitance and the inductance.

* * * * *